(12) United States Patent
Kang et al.

(10) Patent No.: US 10,168,405 B2
(45) Date of Patent: Jan. 1, 2019

(54) METHOD AND APPARATUS FOR QUANTIFYING PROPERTIES OF AN OBJECT THROUGH MAGNETIC RESONANCE IMAGING (MRI)

(71) Applicants: SAMSUNG ELECTRONICS CO., LTD., Suwon-si (KR); INDUSTRY-ACADEMIC COOPERATION FOUNDATION, YONSEI UNIVERSITY, Seoul (KR)

(72) Inventors: Lae-hoon Kang, Suwon-si (KR); Dong-hyun Kim, Seoul (KR); Min-oh Kim, Seoul (KR); Dong-yeob Han, Seoul (KR); Do-sik Hwang, Seoul (KR); Yong-sup Park, Seoul (KR); Jong-buhm Park, Suwon-si (KR); Jae-sung Lee, Seoul (KR)

(73) Assignees: SAMSUNG ELECTRONICS CO., LTD., Suwon-si (KR); INDUSTRY-ACADEMIC COOPERATION FOUNDATION, YONSEI UNIVERSITY, Seoul (KR)

(*) Notice: Subject to any disclaimer, the term of this patent is extended or adjusted under 35 U.S.C. 154(b) by 501 days.

(21) Appl. No.: 14/938,123

(22) Filed: Nov. 11, 2015

(65) Prior Publication Data

US 2016/0131729 A1    May 12, 2016

Related U.S. Application Data

(60) Provisional application No. 62/078,060, filed on Nov. 11, 2014.

(30) Foreign Application Priority Data

Oct. 6, 2015   (KR) ........................ 10-2015-0140613

(51) Int. Cl.
| | | |
|---|---|---|
| *G01R 33/50* | (2006.01) | |
| *G01R 33/48* | (2006.01) | |
| *G01R 33/561* | (2006.01) | |

(52) U.S. Cl.
CPC ......... *G01R 33/50* (2013.01); *G01R 33/4828* (2013.01); *G01R 33/4824* (2013.01); *G01R 33/5611* (2013.01)

(58) Field of Classification Search
CPC ............................ G01R 33/50; G01R 33/4828
See application file for complete search history.

(56) References Cited

U.S. PATENT DOCUMENTS

| | | |
|---|---|---|
| 8,488,859 B2 | 7/2013 | Gilson |
| 8,723,518 B2 | 5/2014 | Seiberlich et al. |

(Continued)

FOREIGN PATENT DOCUMENTS

WO    2009/129138 A1    10/2009

OTHER PUBLICATIONS

Ma, et al.; "Magnetic Resonance Fingerprinting", Nature, Mar. 2013, vol. 495, No. 7440, 11 pages total.

(Continued)

*Primary Examiner* — Daniel Miller
(74) *Attorney, Agent, or Firm* — Sughrue Mion, PLLC

(57) ABSTRACT

Provided are a method and apparatus for processing a magnetic resonance (MR) image of an object including first and second materials on a magnetic resonance imaging (MRI) apparatus by using multi-parameter mapping including applying to the object a plurality of radio frequency (RF) pulses separated by a first repetition time and a second repetition time, the first repetition time and the second repetition time being determined based on the first material and the second material; undersampling first MR signals corresponding to the first material and second MR signals (Continued)

corresponding to the second material in a K-space; and performing matching between the undersampled first and the undersampled second MR signals and a signal model for the multi-parameter mapping to determine attribute values corresponding to the first and the second materials at at least one point in an MR image of the object.

16 Claims, 36 Drawing Sheets

(56) References Cited

U.S. PATENT DOCUMENTS

| | | | |
|---|---|---|---|
| 2005/0171422 A1* | 8/2005 | Zhang | A61B 5/055 600/410 |
| 2011/0096974 A1 | 4/2011 | Gilson | |

OTHER PUBLICATIONS

Dixon, "Simple Proton Spectroscopic Imaging", Radiology, Oct. 1984, vol. 153, No. 1, 6 pages total.

Reeder, et al.; "Iterative Decomposition of Water and Fat with Echo Asymmetry and Least-Squares Estimation (IDEAL): Application with Fast Spin-Echo Imaging", Magnetic Resonance in Medicine, Sep. 2005, vol. 54, 10 pages total.

Yu, et al.; "Multiecho Reconstruction for Simultaneous Water-Fat Decomposition and T2 Estimation", Journal of Magnetic Resonance Imaging, Oct. 2007, vol. 26, 9 pages total.

Han, et al.; "In-Vivo T1 and T2 Measurements of Muskuloskeletal Tissue at 3T and 1.5T", Proceedings of the International Society for Magnetic Resonance in Medicine, 2003, vol. 11, 1 page total.

* cited by examiner

FIG. 14E

| Tissue | T1 (ms) | | T2 (ms) | |
|---|---|---|---|---|
| | 1.5T | 3T | 1.5T | 3T |
| muscle | 1130±91.7 | 1420±38.1 | 35.3±3.85 | 31.7±1.90 |
| cartilage | 1060±155 | 1240±107 | 42.1±7.05 | 36.9±3.81 |
| synovial fluid | 2850±279 | 3620±320 | 1210±140 | 767±48.8 |
| marrow | 288±8.42 | 371±7.94 | 165±5.50 | 133±4.43 |
| subcutaneous fat | 288±5.27 | 365±9.0 | 165±4.96 | 133±6.14 |

METHOD AND APPARATUS FOR QUANTIFYING PROPERTIES OF AN OBJECT THROUGH MAGNETIC RESONANCE IMAGING (MRI)

CROSS-REFERENCE TO RELATED APPLICATIONS

This application claims the benefit of U.S. Provisional Application No. 62/078,060, filed on Nov. 11, 2014, in the US Patent Office and priority from Korean Patent Application No. 10-2015-0140613, filed on Oct. 6, 2015, in the Korean Intellectual Property Office, the disclosures of which are incorporated herein in their entireties by reference.

BACKGROUND

1. Field

The present disclosure relates to magnetic resonance imaging (MRI) apparatuses and methods of processing images on the MRI apparatuses, and more particularly, to MRI apparatuses and methods of distinguishing and quantifying properties of an object via MRI.

2. Description of the Related Art

An MRI apparatus uses a magnetic field to capture an image of a subject, and is widely used in the accurate diagnosis of diseases because it shows stereoscopic images of bones, lumbar discs, joints, and nerve ligaments at desired angles.

The MRI apparatus is configured to acquire MR signals and reconstruct the acquired MR signals into an image to be output. Specifically, the MRI apparatus acquires MR signals by using a radio frequency (RF) multi-coil including RF coils, a permanent magnet, and gradient coils.

In detail, by using a pulse sequence for generating RF signals, RF signals may be applied to an object via the RF multi-coil and an MR image may be reconstructed by sampling MR signals corresponding to the applied RF signals.

In current MRI apparatuses, an average scan time is about 30 minutes. In general, an MRI apparatus includes an elongated, narrow tube (hereinafter, referred to as an 'MRI tube'). A patient that will undergo MRI is placed inside the MRI tube and needs to remain still therein during the scanning process. Thus, patients having serious disease or having a fear of enclosed spaces (claustrophobia) have difficulty undergoing an MRI scan, and most patients may feel bored and uncomfortable during a long scan time.

To solve these problems, an image processing apparatus and method that are capable of shortening MRI scan time are needed.

Various approaches have been attempted to reduce an MRI scan time. For example, without sampling all lines in K-space, by undersampling MR signals along equally spaced lines in K-space and calibrating undersampled K-space data, a final MR image may be reconstructed.

A Generalized Auto-calibrating Partially Parallel Acquisition (GRAPPA) technique is a K-space based imaging method. In the GRAPPA technique spatial correlation coefficients or convolution kernel coefficients that are spatial interaction values between a calibration signal and an adjacent measured source signal are calculated by self-calibration, and unmeasured signals may be estimated by using the calculated spatial correlation coefficients, so that the MRI scan time may be reduced.

In detail, in the GRAPPA technique, unacquired K-space lines for each channel may be restored by using measured line data that are undersampled data and additionally acquired auto-calibrating (ACS) line data.

Multi-parameter mapping may be used to shorten an MRI scan time and quantify a plurality of parameters. To quantify parameters for an object, instead of traditional techniques to repeatedly acquire data, multi-parameter mapping may employ a pseudorandomized acquisition technique causing MR signals from a material or tissue to have unique signal evolutions respectively, like fingerprints. For example, MR fingerprinting technique may be used as one of the multi-parameter mapping methods.

The acquired MR signals may be converted into a quantitative map of parameters by performing matching between a predicted signal evolution and a prestored signal model.

In multi-parameter mapping, pseudorandomized flip angle and repetition time (TR) may be used so that MR signals from a material or tissue to have unique signal evolutions respectively.

However, use of pseudorandomized flip angle and repetition time (TR) results in loss of signal-to-noise ratio (SNR), and for a fat signal or a signal having a large off-resonance, parameters may not be quantified properly. Another problem is that MR signals from different materials may not clearly be distinguished from each other. If MR signals are not clearly distinguished from each other, the probability of errors during matching between a signal evolution and a signal model increases, and thus reliability on quantified parameters may be reduced.

SUMMARY

Provided are magnetic resonance imaging (MRI) apparatuses and methods of processing images on the MRI apparatuses, which are capable of suppressing loss of signal-to-noise ratio (SNR) and effectively quantifying parameters for a fat signal or a signal having a large off-resonance.

Provided are MRI apparatuses and methods of processing images on the MRI apparatuses, which are capable of effectively separating MR signals of different materials from one another.

Additional aspects will be set forth in part in the description which follows and, in part, will be apparent from the description, or may be learned by practice of the present exemplary embodiments.

According to an aspect of an exemplary embodiment, a method of processing an MR image of an object including first and second materials on an MRI apparatus by using multi-parameter mapping includes: applying to the object a plurality of radio frequency (RF) pulses separated by a first repetition time and a second repetition time, both of which are determined based on the first and second materials; undersampling first MR signals corresponding to the first material and second MR signals corresponding to the second material in a K-space; and performing matching between the undersampled first and second MR signals and a signal model for the multi-parameter mapping to determine attribute values corresponding to the first and second materials at at least one point in an MR image of the object.

The first and second repetition times may be determined in order to increase orthogonality between the first and second MR signals.

The first and second repetition times may be determined based on a difference between resonant frequencies of the first and second materials.

The first repetition time may be determined so that the first and second MR signals are in phase, and the second repetition time may be determined so that the first and second MR signals are out of phase.

The plurality of RF pulses may be separated by a number (n) of repetition times comprising the first and second repetition times, and the n repetition times may be determined in order to increase orthogonality between the first and second MR signals.

The n repetition times may be determined so that the first and second MR signals have a phase difference of $(2\pi k)/n$ with respect to each other, and k is natural numbers from 1 to n.

The plurality of RF pulses may be separated by a first interval during which the first repetition time is repeated a plurality of times and a second interval during which the second repetition time is repeated a plurality of times.

The first and second intervals may be alternately repeated.

A number of times the first repetition time is repeated during the first interval may be equal to a number of times the second repetition time is repeated during the second interval.

The attribute values corresponding to the first and second materials at the at least one point in the MR image of the object may include at least one selected from fractions of the first and second materials, T1 and T2 of the first material, T1 and T2 of the second material, and off-resonance between the first and second materials.

According to an aspect of an exemplary embodiment, an apparatus for processing an MR image of an object including first and second materials on an MRI apparatus by using multi-parameter mapping includes: an RF controller configured to apply to the object a plurality of RF pulses separated by a first repetition time and a second repetition time, both of which are determined based on the first and second materials; a data acquisition unit configured to undersample first MR signals corresponding to the first material and second MR signals corresponding to the second material in a K-space; and an image processor configured to perform matching between the undersampled first and second MR signals and a signal model for the multi-parameter mapping to determine attribute values corresponding to the first and second materials at at least one point in an MR image of the object.

The first and second repetition times may be determined in order to increase orthogonality between the first and second MR signals.

The first and second repetition times may be determined based on a difference between resonant frequencies of the first and second materials.

The first repetition time may be determined so that the first and second MR signals are in phase, and the second repetition time may be determined so that the first and second MR signals are out of phase.

The plurality of RF pulses may be separated by a number (n) of repetition times comprising the first and second repetition times, and the n repetition times may be determined in order to increase orthogonality between the first and second MR signals.

The n repetition times may be determined so that the first and second MR signals have a phase difference of $(2\pi k)/n$ with respect to each other, and k is natural numbers from 1 to n.

The plurality of RF pulses may be separated by a first interval during which the first repetition time is repeated a plurality of times and a second interval during which the second repetition time is repeated a plurality of times.

The first and second intervals may be alternately repeated.

A number of times the first repetition time is repeated during the first interval may be equal to a number of times the second repetition time is repeated during the second interval.

According to an aspect of an exemplary embodiment, a non-transitory computer-readable recording medium has recorded thereon a program for executing the method according to the aspect of the exemplary embodiment on a computer.

BRIEF DESCRIPTION OF THE DRAWINGS

These and/or other aspects will become apparent and more readily appreciated from the following description of the exemplary embodiments, taken in conjunction with the accompanying drawings in which:

FIG. 14E is a table showing T1 and T2 values of tissues in a biological object, obtained according to the first experiment;

DETAILED DESCRIPTION

Figure 1:
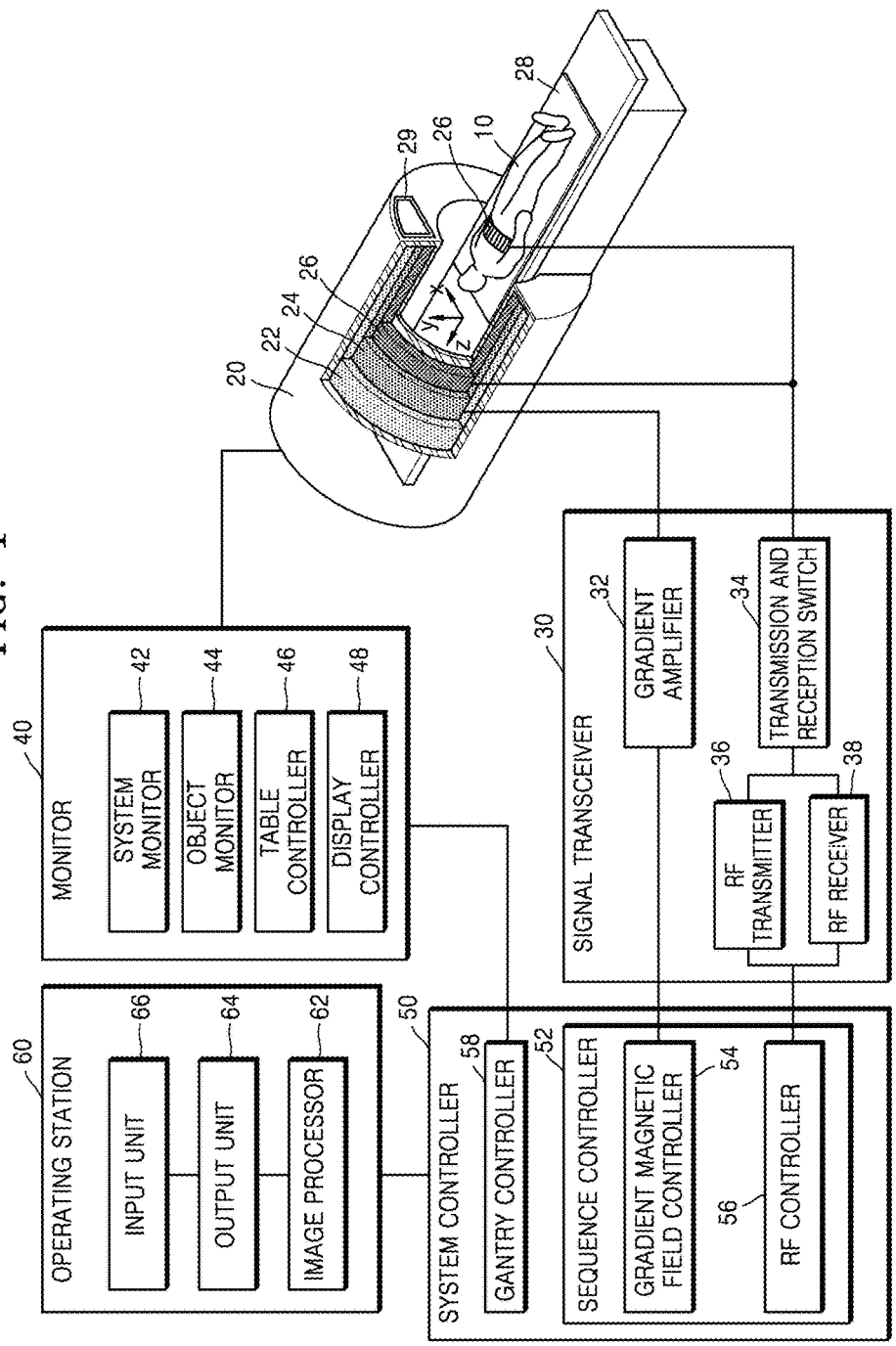
FIG. 1 is a block diagram of a general magnetic resonance imaging (MRI) system.

Advantages and features of one or more embodiments of the present exemplary embodiments and methods of accomplishing the same may be understood more readily by reference to the following detailed description of the embodiments and the accompanying drawings. In this regard, the present embodiments may have different forms and should not be construed as being limited to the descriptions set forth herein. Rather, these embodiments are provided so that this disclosure will be thorough and complete and will fully convey the concept of the present embodiments to one of ordinary skill in the art, and the exemplary embodiments will only be defined by the appended claims.

Terms used herein will now be briefly described and then one or more exemplary embodiments will be described in detail.

All terms including descriptive or technical terms which are used herein should be construed as having meanings that are obvious to one of ordinary skill in the art. However, the terms may have different meanings according to the intention of one of ordinary skill in the art, precedent cases, or the appearance of new technologies. Also, some terms may be arbitrarily selected by the applicant, and in this case, the meaning of the selected terms will be described in detail in the detailed description. Thus, the terms used herein have to be defined based on the meaning of the terms together with the description throughout the specification.

When a part "includes" or "comprises" an element, unless there is a particular description contrary thereto, the part can further include other elements, not excluding the other elements. Also, the term "unit" in the exemplary embodiments means a software component or hardware component such as a field-programmable gate array (FPGA) or an application-specific integrated circuit (ASIC), and performs a specific function. However, the term "unit" is not limited to software or hardware. The "unit" may be formed so as to be in an addressable storage medium, or may be formed so as to operate one or more processors. Thus, for example, the term "unit" may refer to components such as software components, object-oriented software components, class components, and task components, and may include processes, functions, attributes, procedures, subroutines, segments of program code, drivers, firmware, micro codes, circuits, data, a database, data structures, tables, arrays, or variables. A function provided by the components and "units" may be associated with the smaller number of components and "units", or may be divided into additional components and "units".

Reference will now be made in detail to embodiments, examples of which are illustrated in the accompanying drawings. In the following description, well-known functions or constructions are not described in detail so as not to obscure the embodiments with unnecessary detail. Expressions such as "at least one of," when preceding a list of elements, modify the entire list of elements and do not modify the individual elements of the list.

In the present specification, an "image" may refer to multi-dimensional data composed of discrete image elements (e.g., pixels in a two-dimensional (2D) image and voxels in a three-dimensional (3D) image). For example, the image may be a medical image of an object captured by an X-ray apparatus, a computed tomography (CT) apparatus, a magnetic resonance imaging (MRI) apparatus, an ultrasound diagnosis apparatus, or another medical imaging apparatus.

Furthermore, in the present specification, an "object" may be a human, an animal, or a part of a human or animal. For example, the object may be an organ (e.g., the liver, the heart, the womb, the brain, a breast, or the abdomen), a blood vessel, or a combination thereof. Furthermore, the "object" may be a phantom. The phantom means a material having a density, an effective atomic number, and a volume that are approximately the same as those of an organism. For example, the phantom may be a spherical phantom having properties similar to the human body.

Furthermore, in the present specification, a "user" may be, but is not limited to, a medical expert, such as a medical doctor, a nurse, a medical laboratory technologist, or a technician who repairs a medical apparatus.

Furthermore, in the present specification, an "MR image" refers to an image of an object obtained by using the nuclear magnetic resonance principle.

Furthermore, in the present specification, a "pulse sequence" refers to continuity of signals repeatedly applied by an MRI apparatus. The pulse sequence may include a time parameter of a radio frequency (RF) pulse, for example, repetition time (TR) or echo time (TE).

Furthermore, in the present specification, a "pulse sequence schematic diagram" shows an order of events that occur in an MRI apparatus. For example, the pulse sequence schematic diagram may be a diagram showing an RF pulse, a gradient magnetic field, an MR signal, or the like according to time.

Furthermore, in the present specification, "repetition time (TR)" may be repetition time of an RF pulse. For example, the repetition time (TR) may be defined as a time range, from the time an RF pulse with a predetermined magnitude is transmitted to the time an RF pulse with the same magnitude is transmitted again.

Furthermore, in the present specification, "time to echo (TE)" may be defined as time range, from the time of an RF pulse is transmitted to the time its MR signal is acquired.

Furthermore, in the present specification, "spatial encoding" may mean acquisition of spatial information along an axis (direction) of a gradient magnetic field by applying a linear gradient magnetic field that induces extra dephasing) of proton spins, in addition to dephasing of proton spins caused by an RF signal.

An MRI system is an apparatus for acquiring a sectional image of a part of an object by expressing, in a contrast comparison, a strength of a MR signal with respect to a radio frequency (RF) signal generated in a magnetic field having a specific strength. For example, if an RF signal that only resonates a specific atomic nucleus (for example, a hydrogen atomic nucleus) is emitted for an instant toward the object placed in a strong magnetic field and then such emission stops, an MR signal is emitted from the specific atomic nucleus, and thus the MRI system may receive the MR signal and acquire an MR image. The MR signal denotes an RF signal emitted from the object. An intensity of the MR signal may be determined according to a density of a predetermined atom (for example, hydrogen) of the object, a relaxation time T1, a relaxation time T2, and a flow of blood or the like.

Since hydrogen atoms form water molecules occupying over 70% of a human body, MR signals emitted from nuclei of hydrogen atoms have higher intensities than other MR signals emitted from other types of atomic nuclei in the human body. In general, an MR image may be generated using MR signals emitted from nuclei of hydrogen atoms.

MRI systems include characteristics different from those of other imaging apparatuses. Unlike imaging apparatuses such as CT apparatuses that acquire images according to a direction of detection hardware, MRI systems may acquire 2D images or 3D volume images that are oriented toward an optional point. MRI systems do not expose objects or examiners to radiation, unlike CT apparatuses, X-ray apparatuses, position emission tomography (PET) apparatuses, and single photon emission CT (SPECT) apparatuses, may acquire images having high soft tissue contrast, and may acquire neurological images, intravascular images, musculoskeletal images, and oncologic images that are required to precisely capturing abnormal tissues.

Exemplary embodiments will now be described more fully hereinafter with reference to the accompanying drawings so that they may be easily implemented by one of ordinary skill in the art. However, the present embodiments may have different forms and should not be construed as being limited to the descriptions set forth herein. In addition, known parts are omitted to clarify the description of exemplary embodiments. Like reference numerals refer to like elements throughout.

FIG. 1 is a block diagram of a general MRI system. Referring to FIG. 1, the general MRI system may include a gantry 20, a signal transceiver 30, a monitoring unit 40, a system control unit 50, and an operating unit 60.

The gantry 20 prevents external emission of electromagnetic waves generated by a main magnet 22, a gradient coil 24, and an RF coil 26. A magnetostatic field and a gradient magnetic field are formed in a bore in the gantry 20, and an RF signal is emitted toward an object 10.

The main magnet 22, the gradient coil 24, and the RF coil 26 may be arranged in a predetermined direction of the gantry 20. The predetermined direction may be a coaxial cylinder direction. The object 10 may be disposed on a table 28 that is capable of being inserted into a cylinder along a horizontal axis of the cylinder.

The main magnet 22 generates a magnetostatic field or a static magnetic field for aligning magnetic dipole moments of atomic nuclei of the object 10 in a constant direction. A precise and accurate MR image of the object 10 may be obtained due to a magnetic field generated by the main magnet 22 being strong and uniform.

Examples of magnets for generating a static magnetic field include a permanent magnet, a room-temperature electromagnet, or a superconducting electromagnet. A superconducting electromagnet that produces a strong, highly uniform field may be mainly used as the main magnet 22. For example, when hydrogen atoms in the human body are placed within a static magnetic field generated by the main magnet 22, nuclei of the hydrogen atoms may have magnetic dipole moments aligned in the direction of the static magnetic field so as to reach a lower energy state. To maintain a thermal equilibrium state, the number of atomic nuclei in a low energy state is actually slightly greater than the number of atomic nuclei in a high energy state. Here, an energy difference between atomic nuclei in different energy states is proportional to a strength of a magnetic field, and each atomic nucleus has a Larmor frequency. For example, if a magnetic field generated by the main magnet 22 has a strength of 1 tesla, a nucleus of a hydrogen atom has a Larmor frequency of about 42.58 MHz in this magnetic field.

The gradient coil 24 includes X, Y, and Z coils for generating gradient magnetic fields in X-, Y-, and Z-axis directions crossing each other at right angles. The gradient coil 24 may provide location information of each region of the object 10 by inducing resonance frequencies differently according to the regions of the object 10.

The RF coil 26 may emit an RF signal toward a patient and receive an MR signal emitted from the patient. In detail, the RF coil 26 may transmit, toward atomic nuclei included in the patient and having precessional motion, an RF signal having the same frequency as that of the precessional motion, stop transmitting the RF signal, and then receive an MR signal emitted from the atomic nuclei included in the patient.

For example, in order to transit an atomic nucleus from a low energy state to a high energy state, the RF coil 26 may generate and apply an electromagnetic wave signal that is an RF signal corresponding to a type of the atomic nucleus, to the object 10. When the electromagnetic wave signal generated by the RF coil 26 is applied to the atomic nucleus, the atomic nucleus may transit from the low energy state to the high energy state. Then, when electromagnetic waves generated by the RF coil 26 disappear, the atomic nucleus to which the electromagnetic waves were applied transits from the high energy state to the low energy state, thereby emitting electromagnetic waves having a Lamor frequency. In other words, when the application of the electromagnetic wave signal to the atomic nucleus is stopped, an energy level of the atomic nucleus is changed from a high energy level to a low energy level, and thus the atomic nucleus may emit electromagnetic waves having a Lamor frequency. The RF coil 26 may receive electromagnetic wave signals from atomic nuclei included in the object 10. Here, the received electromagnetic wave signals may also be referred to as free induction decay (FID) signals.

The RF coil 26 may be realized as one RF transmitting and receiving coil having both a function of generating electromagnetic waves each having an RF that corresponds to a type of an atomic nucleus and a function of receiving electromagnetic waves emitted from an atomic nucleus. Alternatively, the RF coil 26 may be realized as a transmission RF coil having a function of generating electromagnetic waves each having an RF that corresponds to a type of an atomic nucleus, and a reception RF coil having a function of receiving electromagnetic waves emitted from an atomic nucleus.

The RF coil 26 may be fixed to the gantry 20 or may be detachable. When the RF coil 26 is detachable, the RF coil 26 may be an RF coil for a part of the object, such as a head RF coil, a chest RF coil, a leg RF coil, a neck RF coil, a shoulder RF coil, a wrist RF coil, or an ankle RF coil.

The RF coil 26 may communicate with an external apparatus via wires and/or wirelessly, and may also perform dual tune communication according to a communication frequency band.

The RF coil 26 may be a birdcage coil, a surface coil, or a transverse electromagnetic (TEM) coil.

The RF coil 26 may be a transmission exclusive coil, a reception exclusive coil, or a transmission and reception coil according to methods of transmitting and receiving an RF signal.

The RF coil 26 may be an RF coil having various numbers of channels, such as 16 channels, 32 channels, 72 channels, and 144 channels.

The gantry 20 may further include a display 29 disposed outside the gantry 20 and a display (not shown) disposed inside the gantry 20. The gantry 20 may provide predetermined information to the user or the object 10 through the display 29 and the display respectively disposed outside and inside the gantry 20.

The signal transceiver 30 may control the gradient magnetic field formed inside the gantry 20, i.e., in the bore, according to a predetermined MR sequence, and control transmission and reception of an RF signal and an MR signal.

The signal transceiver 30 may include a gradient amplifier 32, a transmission and reception switch 34, an RF transmitter 36, and an RF receiver 38.

The gradient amplifier 32 drives the gradient coil 24 included in the gantry 20, and may supply a pulse signal for generating a gradient magnetic field to the gradient coil 24 under the control of a gradient magnetic field controller 54. By controlling the pulse signal supplied from the gradient amplifier 32 to the gradient coil 24, gradient magnetic fields in X-, Y-, and Z-axis directions may be synthesized.

The RF transmitter 36 and the RF receiver 38 may drive the RF coil 26. The RF transmitter 36 may supply an RF pulse in a Lamor frequency to the RF coil 26, and the RF receiver 38 may receive an MR signal received by the RF coil 26.

The transmission and reception switch 34 may adjust transmitting and receiving directions of the RF signal and the MR signal. For example, the transmission and reception switch 34 may emit the RF signal toward the object 10 through the RF coil 26 during a transmission mode, and receive the MR signal from the object 10 through the RF coil 26 during a reception mode. The transmission and reception switch 34 may be controlled by a control signal output by an RF controller 56.

The monitoring unit 40 may monitor or control the gantry 20 or devices mounted on the gantry 20. The monitoring unit 40 may include a system monitoring unit 42, an object monitoring unit 44, a table controller 46, and a display controller 48.

The system monitoring unit 42 may monitor and control a state of the magnetostatic field, a state of the gradient magnetic field, a state of the RF signal, a state of the RF coil 26, a state of the table 28, a state of a device measuring body information of the object 10, a power supply state, a state of a thermal exchanger, and a state of a compressor.

The object monitoring unit 44 monitors a state of the object 10. In detail, the object monitoring unit 44 may include a camera for observing a movement or position of the object 10, a respiration measurer for measuring the respiration of the object 10, an electrocardiogram (ECG) measurer for measuring the electrical activity of the object 10, or a temperature measurer for measuring a temperature of the object 10.

The table controller 46 controls a movement of the table 28 where the object 10 is positioned. The table controller 46 may control the movement of the table 28 according to a sequence control of a sequence controller 50. For example, during moving imaging of the object 10, the table controller 46 may continuously or discontinuously move the table 28 according to the sequence control of the sequence controller 50, and thus the object 10 may be photographed in a field of view (FOV) larger than that of the gantry 20.

The display controller 48 controls the display 29 disposed outside the gantry 20 and the display disposed inside the gantry 20. In detail, the display controller 48 may control the display 29 and the display to be on or off, and may control a screen image to be output on the display 29 and the display. Also, when a speaker is located inside or outside the gantry 20, the display controller 48 may control the speaker to be on or off, or may control sound to be output via the speaker.

The system control unit 50 may include the sequence controller 52 for controlling a sequence of signals formed in the gantry 20, and a gantry controller 58 for controlling the gantry 20 and the devices mounted on the gantry 20.

The sequence controller 52 may include the gradient magnetic field controller 54 for controlling the gradient amplifier 32, and the RF controller 56 for controlling the RF transmitter 36, the RF receiver 38, and the transmission and reception switch 34. The sequence controller 52 may control the gradient amplifier 32, the RF transmitter 36, the RF receiver 38, and the transmission and reception switch 34 according to a pulse sequence received from the operating unit 60. Here, the pulse sequence includes all information required to control the gradient amplifier 32, the RF transmitter 36, the RF receiver 38, and the transmission and reception switch 34. For example, the pulse sequence may include information about a strength, an application time, and application timing of a pulse signal applied to the gradient coil 24.

The operating unit 60 may request the system control unit 50 to transmit pulse sequence information while controlling an overall operation of the MRI system.

The operating unit 60 may include an image processor 62 for receiving and processing the MR signal received by the RF receiver 38, an output unit 64, and an input unit 66.

The image processor 62 may process the MR signal received from the RF receiver 38 so as to generate MR image data of the object 10.

The image processor 62 receives the MR signal received by the RF receiver 38 and performs any one of various signal processes, such as amplification, frequency transformation, phase detection, low frequency amplification, and filtering, on the received MR signal.

The image processor 62 may arrange digital data in a K-space (for example, also referred to as a Fourier space or a frequency space) of a memory, and rearrange the digital data into image data via 2D or 3D Fourier transformation.

The image processor 62 may perform a composition process or a difference calculation process on the image data if required. The composition process may include an addition process on a pixel or a maximum intensity projection (MIP) process. The image processor 62 may store not only the rearranged image data but also image data on which a composition process or a difference calculation process is performed, in a memory (not shown) or an external server.

The image processor 62 may perform any of the signal processes on the MR signal in parallel. For example, the image processor 62 may perform a signal process on a plurality of MR signals received by a multi-channel RF coil in parallel so as to rearrange the plurality of MR signals into image data.

The output unit 64 may output image data generated or rearranged by the image processor 62 to the user. The output unit 64 may also output information required for the user to manipulate the MRI system, such as a user interface (UI), user information, or object information. The output unit 64 may be a speaker, a printer, a cathode-ray tube (CRT) display, a liquid crystal display (LCD), a plasma display panel (PDP), an organic light-emitting device (OLED) display, a field emission display (FED), a light-emitting diode (LED) display, a vacuum fluorescent display (VFD), a digital light processing (DLP) display, a flat panel display (FPD), a 3-dimensional (3D) display, a transparent display, or any one of other various output devices that are well known to one of ordinary skill in the art.

The user may input object information, parameter information, a scan condition, a pulse sequence, or information about image composition or difference calculation by using the input unit 66. The input unit 66 may be a keyboard, a mouse, a track ball, a voice recognizer, a gesture recognizer, a touch screen, or any one of other various input devices that are well known to one of ordinary skill in the art.

The signal transceiver 30, the monitoring unit 40, the system control unit 50, and the operating unit 60 are separate components in FIG. 1, but it will be obvious to one of ordinary skill in the art that respective functions of the signal transceiver 30, the monitoring unit 40, the system control unit 50, and the operating unit 60 may be performed by another component. For example, the image processor 62 converts the MR signal received from the RF receiver 38 into a digital signal in FIG. 1, but alternatively, the conversion of the MR signal into the digital signal may be performed by the RF receiver 38 or the RF coil 26.

The gantry 20, the RF coil 26, the signal transceiver 30, the monitoring unit 40, the system control unit 50, and the operating unit 60 may be connected to each other by wire or wirelessly, and when they are connected wirelessly, the MRI system may further include an apparatus (not shown) for synchronizing clock signals therebetween. Communication between the gantry 20, the RF coil 26, the signal transceiver 30, the monitoring unit 40, the system control unit 50, and the operating unit 60 may be performed by using a high-speed digital interface, such as low voltage differential signaling (LVDS), asynchronous serial communication, such as a universal asynchronous receiver transmitter (UART), a low-delay network protocol, such as error synchronous serial communication or a controller area network (CAN), optical communication, or any of other various communication methods that are well known to one of ordinary skill in the art.

The MRI system may further include a communication unit.

Figure 2:
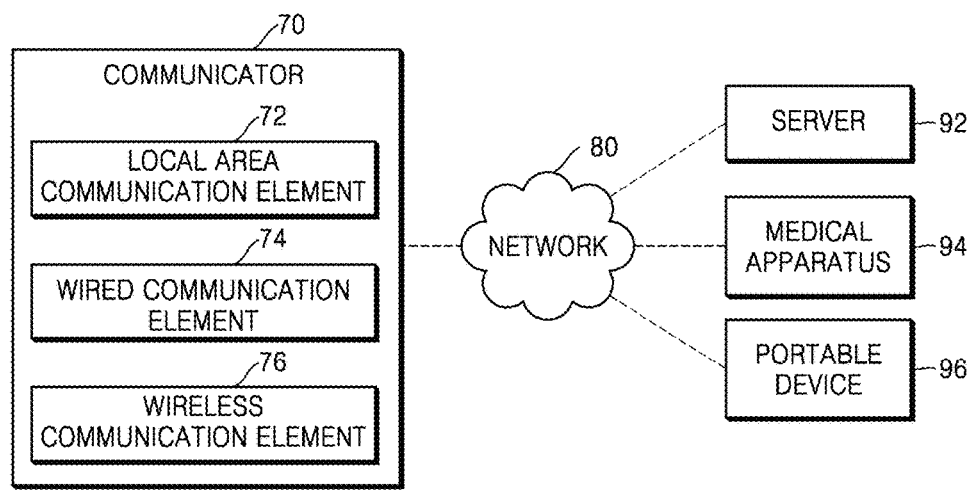
FIG. 2 is a detailed diagram of a communication unit included in the MRI system of FIG. 1.

FIG. 2 is a block diagram of a communication unit 70 according to an exemplary embodiment. Referring to FIG. 2, the communication unit 70 may be connected to at least one selected from the gantry 20, the signal transceiver 30, the monitoring unit 40, the system control unit 50, and the operating unit 60 of FIG. 1.

The communication unit 70 may transmit and receive data to and from a hospital server or another medical apparatus in a hospital, which is connected through a picture archiving and communication system (PACS), and perform data communication according to the digital imaging and communications in medicine (DICOM) standard.

As shown in FIG. 2, the communication unit 70 may be connected to a network 80 by wire or wirelessly to communicate with a server 92, a medical apparatus 94, or a portable device 96.

In detail, the communication unit 70 may transmit and receive data related to the diagnosis of an object through the network 80, and may also transmit and receive a medical image captured by the medical apparatus 94, such as a CT apparatus, an MRI apparatus, or an X-ray apparatus. In addition, the communication unit 70 may receive a diagnosis history or a treatment schedule of the object from the server 92 and use the same to diagnose the object. The communication unit 70 may perform data communication not only with the server 92 or the medical apparatus 94 in a hospital, but also with the portable device 96, such as a mobile phone, a personal digital assistant (PDA), or a laptop of a doctor or patient.

Also, the communication unit 70 may transmit information about a malfunction of the MRI system or about a medical image quality to a user through the network 80, and receive a feedback regarding the information from the user.

The communication unit 70 may include at least one component enabling communication with an external apparatus.

For example, the communication unit 70 may include a local area communication module 72, a wired communication module 74, and a wireless communication module 76. The local area communication module 72 refers to a module for performing local area communication with an apparatus within a predetermined distance. Examples of local area communication technology according to an exemplary embodiment include, but are not limited to, a wireless local area network (LAN), Wi-Fi, Bluetooth, ZigBee, Wi-Fi direct (WFD), ultra wideband (UWB), infrared data association (IrDA), Bluetooth low energy (BLE), and near field communication (NFC).

The wired communication module 74 refers to a module for performing communication by using an electric signal or an optical signal. Examples of wired communication technology according to an exemplary embodiment include wired communication techniques using a pair cable, a coaxial cable, and an optical fiber cable, and other well known wired communication techniques.

The wireless communication module 76 transmits and receives a wireless signal to and from at least one selected from a base station, an external apparatus, and a server in a mobile communication network. Here, the wireless signal may be a voice call signal, a video call signal, or data in any one of various formats according to transmission and reception of a text/multimedia message.

Figure 3:
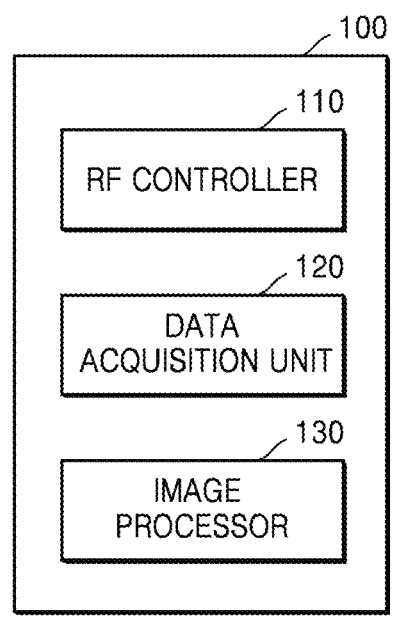
FIG. 3 is a block diagram of an MRI apparatus according to an exemplary embodiment.

FIG. 3 is a block diagram of an MRI apparatus 100 according to an exemplary embodiment.

The MRI apparatus 100 may be any apparatus for reconstructing and/or processing an MR image. In detail, the MRI apparatus 100 may be an apparatus configured to apply RF pulses via a plurality of channel coils in an RF multi coil (not shown) and generate an MR image by using MR signals acquired via the plurality of channel coils. Furthermore, the MRI apparatus 100 may be a magnetic computing device for controlling acquisition of MR signals during an MRI scan.

Referring to FIG. 3, the MRI apparatus 100 may include an RF controller 110, a data acquisition unit 120, and an image processor 130.

The MRI apparatus 100 may be included in the MRI system described with reference to FIGS. 1 and 2. When the MRI apparatus 100 is included in the MRI system described with reference to FIG. 1, the RF controller 110 of the MRI apparatus 100 may correspond to the RF controller 56 of the MRI system or the sequence controller 52 including the RF controller 56, and the data acquisition unit 120 may correspond to the RF receiver 38 of the MRI system or the signal transceiver 30 including the RF receiver 38. The image processor 130 may correspond to the image processor 62 of the MRI system.

To acquire MR images of an object, the RF controller 110 may control information about a signal strength (or signal intensity), application time, and application timing of an RF pulse that is applied via a HF multi-coil (not shown). Here, the HF multi-coil may correspond to the RF coil 26 in the MRI system of FIG. 1.

The RF controller 110 may be connected to the operating unit 60 shown in FIG. 1 and may receive an RF pulse sequence from the operating unit 60 to control an RF pulse.

The MRI apparatus 100 may further include a gradient magnetic field controller (not shown). When the MRI apparatus 100 is included in the MRI system described with reference to FIGS. 1 and 2, the gradient magnetic field controller of the MRI apparatus 100 may correspond to the gradient magnetic field controller 54 of the MRI system or the sequence controller 52 including the gradient magnetic field controller 54.

The MRI apparatus 100 may apply a spatial encoding gradient to the object via the gradient magnetic field controller.

A spatial encoding gradient is applied to the object so that different resonant frequencies may be induced according to regions of the object, and so the MRI apparatus 100 may thereby obtain location information of each of the regions of the object. The MRI apparatus 100 may obtain location information represented in a 3D coordinate system.

Here, the spatial encoding gradient may include a slice gradient, a frequency gradient, and a phase gradient.

The data acquisition unit may obtain an MR signal for reconstructing an MR image by performing MRI on the object. Here, the MR signal may have a form of an RF signal received from each of a plurality of channel coils in the RF multi-coil.

The data acquisition unit 120 may undersample an MR signal in a K-space to acquire the undersampled MR signal.

The data acquisition unit 120 may undersample MR signals respectively received from the plurality of channel coils in the RF multi-coil using a uniform or non-uniform pattern and acquire the undersampled MR signals respectively corresponding to the plurality of channel coils.

The data acquisition unit 120 may transmit the undersampled MR signals to the image processor 130.

The image processor 130 of the MRI apparatus 100 may determine an attribute value corresponding to the object at at least one point in an MR image of the object by performing matching between the undersampled MR signals acquired via the data acquisition unit 120 and a signal model for multi-parameter mapping. Here, the attribute value may be a parameter.

The signal for multi-parameter mapping may be referred to as a data model, an MR fingerprinting database (DB) or dictionary but is not limited thereto, and may be stored in a memory (not shown) or external server.

When the signal model for multi-parameter mapping is stored in the external server, the MR apparatus 100 may further include a communication unit (not shown) for communicating with the external server. The communication unit may correspond to the communication unit 70 described with reference to FIG. 2.

The image processor 130 may generate K-space data by using the received MR signals. The K-space data may be 2D or 3D K-space data. For example, the 2D K-space data have a 2D spatial frequency domain and are formed by using a Kx axis corresponding to frequency encoding and a Ky axis corresponding to phase encoding. Furthermore, 3D K-space data are formed by using the Kx axis, the Ky axis, and a Kz axis corresponding to a progress direction in a space. Here, the Kz axis corresponds to a slice selection gradient.

Furthermore, the MRI apparatus 100 may be connected to the MRI system of FIG. 1 to be operated and may be a computing device for controlling an MRI scan performed by the MRI system. Here, the MRI apparatus 100 may be connected to the RF coil 26 and the gradient coil 24 in the MRI system by wire or wirelessly. The RF controller 110 of the MRI apparatus 100 may control the RF controller 56, the gradient magnetic field controller 54, and the RF coil 26 of the MRI system.

The MRI apparatus may be a server apparatus configured to provide a pulse sequence to be applied to the object, receive MR signals acquired by performing an MRI scan, and reconstruct an MR image by using the received MR signals. Here, the server apparatus may be a medical server apparatus placed in a hospital where a patient undergoes an MRI scan or placed in another place.

The MRI apparatus 100 may be a server, a medical apparatus, or a portable device connected to the MRI system described with reference to FIGS. 1 and 2 to be operated, and may receive MR signals acquired by the MRI system to reconstruct an MR image.

According to an exemplary embodiment, the object may be composed of a plurality of materials. For example, the object may include first and second materials. Here, the first and second materials may be water and fat, respectively, but are not limited thereto.

The RF controller 110 may apply a plurality of RF pulses to the object, and the RF pulses may be separated by first and second repetition times determined based on first and second materials. Here, the first and second repetition times may be repeated alternately in a series of the RF pulses.

After being excited by an RF pulse, atomic nuclei in the object emit MR signals. Here, atomic nuclei contained in the first material are excited by the RF pulse and then may emit first MR signals. Atomic nuclei contained in the second material are excited by the RF pulse and then may emit second MR signals.

The first and second repetition times are determined based on the first and second materials, so it is possible to increase orthogonality between the first MR signals corresponding to the first material and the second MR signals corresponding to the second material.

After the first and second MR signals respectively corresponding to the first and second materials are emitted, the data acquisition unit 120 may receive and undersample the first and second MR signals.

After undersampled MR signals are acquired, the image processor 130 may determine attribute values corresponding to the first and second materials at at least one point in an MR image of the object by performing matching between the acquired undersampled MR signals and a signal model for multi-parameter mapping. Here, one point in the MR image may be a voxel. The matching may be template matching.

For example, the attribute values corresponding to the first and second materials may be fractions of the first and second materials, T1 and T2 of the first material, T1 and T2 of the second material, off-resonance between the first and second materials, etc.

The attribute values corresponding to the first and second materials are determined at each voxel in an MR image so that the MR image may be shown as a map of the attribute values. For example, the MR image may be fraction maps of the first and second materials, T1 and T2 maps of the first material, T1 and T2 maps of the second material, map of off-resonance between the first and second materials, or a B1 phase map of the object, but is not limited thereto.

According to an exemplary embodiment, attribute values corresponding to a plurality of materials in the object at each voxel in an MR image are determined simultaneously, so that various parameters may be effectively quantified by a single scan.

According to an exemplary embodiment, the first and second repetition times are determined based on the first and second materials in the object, so that MR signals from different materials may be effectively separated from each other.

Figure 4:
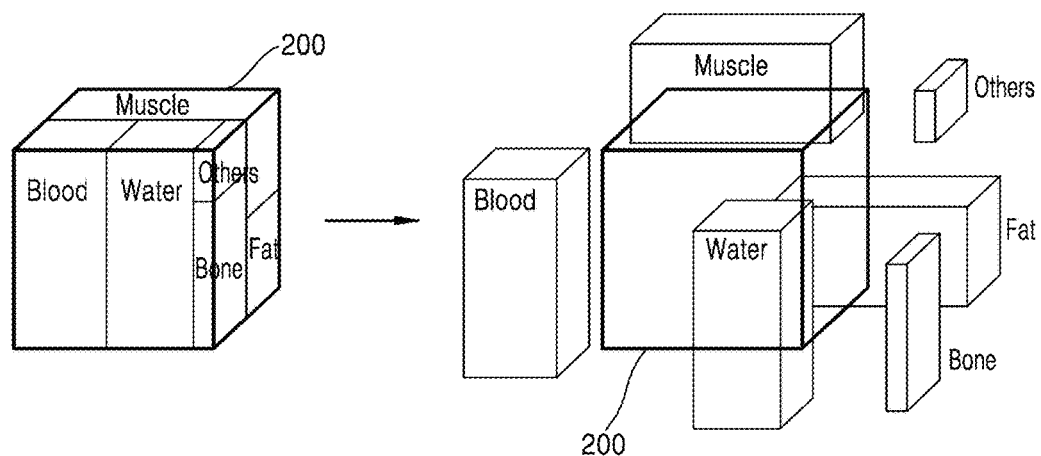
FIG. 4 is a diagram for explaining a voxel and a sub-voxel.

FIG. 4 is a diagram for explaining a voxel and a sub-voxel.

As described above, an MR image of an object may be composed of voxels. Here, a voxel is a piece of graphic information that defines a single point in a 3D space, and the single point may be a volume 200 included in the object.

As shown in FIG. 4, the volume 200 may include various materials. For example, if the object is a biological object, the volume 200 may include water, fat, blood, muscle, and bones. According to conventional MRI, when the volume 200 includes various materials, at a voxel corresponding to the volume 200, a single property value is calculated based on various materials interacting with each other. However, according to multi-parameter mapping, even when the volume 200 includes various materials, attribute values respectively corresponding to the various materials may be calculated at a voxel corresponding to the volume 200. Conceptually, a voxel may include a plurality of sub-voxels, and the various materials in the volume 200 may respectively correspond to the plurality of sub-voxels. Thus, a voxel may correspond to all image attribute values of sub-pixels in the voxel.

According to an exemplary embodiment, attribute values corresponding to a plurality of materials in the object at each voxel in an MR image are determined simultaneously, various parameters may be effectively quantified by a single scan.

Figure 5A:
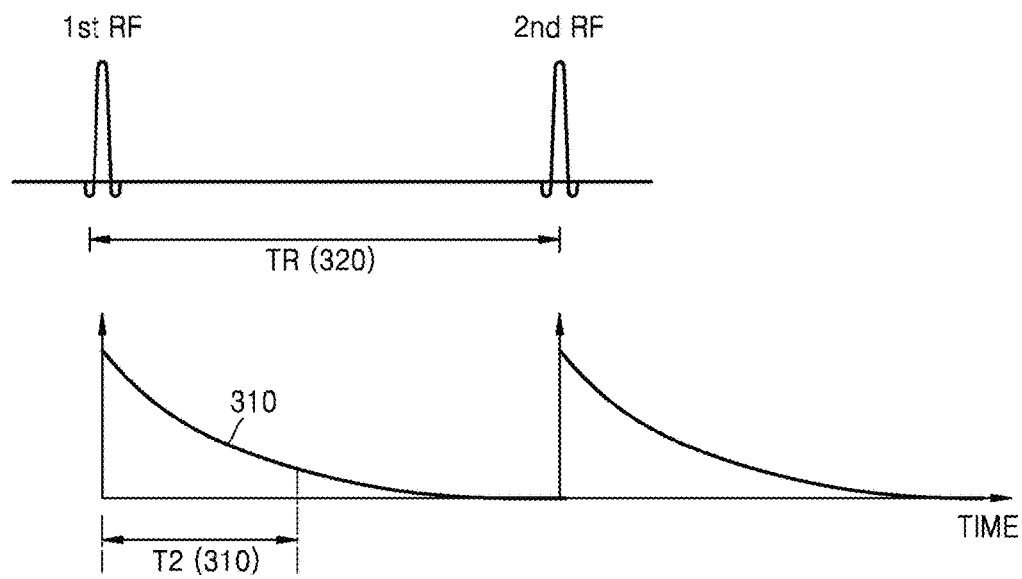
FIGS. 5A and 5B are diagrams for explaining a steady state.
Figure 5B:
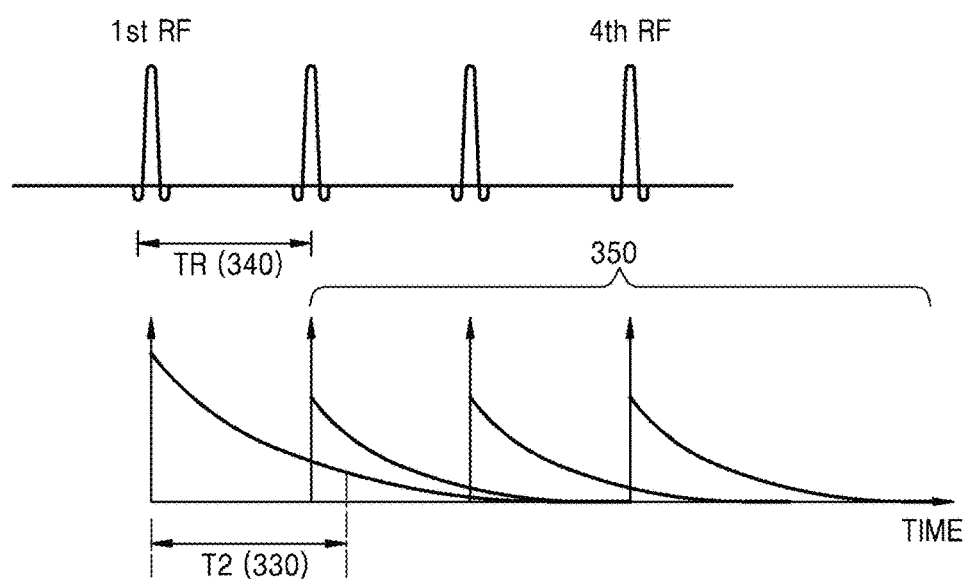

FIGS. 5A and 5B are diagrams for explaining a steady state 350.

Here, the steady state 350 may be a state in which transverse magnetization of spins of atomic nuclei, to which electromagnetic waves have been applied, do not completely decay and remain.

Referring to FIGS. 5A and 5B, the steady state may occur according to a relation between relaxation time T2 310 and repetition time TR 320 of atomic nuclei. Here, the relaxation time T2 310 may be the time range from the time an RF pulse is transmitted to the time transverse magnetization of spins of the atomic nuclei decays to about 37% of its initial value. The repetition time TR 320 may be the time range from the time an RF pulse having a predetermined magnitude is transmitted to the time an RF pulse having the same magnitude is transmitted again.

For example, in case that the RF controller 110 applies RF pulses to an object at intervals of the repetition time TR 320 longer than the relaxation time T2 310 as shown in FIG. 5A, when a second RF pulse is applied to the object, transverse magnetization having the same magnitude as one produced by a first RF pulse may be produced.

However, in case that the RF controller 110 applies RF pulses to the object at intervals of repetition time TR 340 shorter than relaxation time T2 330, a second RF pulse is applied to an object in a state in which transverse magnetization produced by a first RF pulse has not yet completely decayed, and an MR signal emitted by the first RF pulse may affect an MR signal by the second RF pulse. In this way, the transverse magnetization that does not completely decay may keep a certain magnitude, and this may be called the steady state 350. The steady state 350 may also be referred to as an equilibrium state or a stationary state.

Furthermore, residual transverse magnetization in a steady state may be combined with transverse magnetization newly generated by a next RF pulse and cause the magnitude of the newly generated transverse magnetization to increase.

Figure 6:
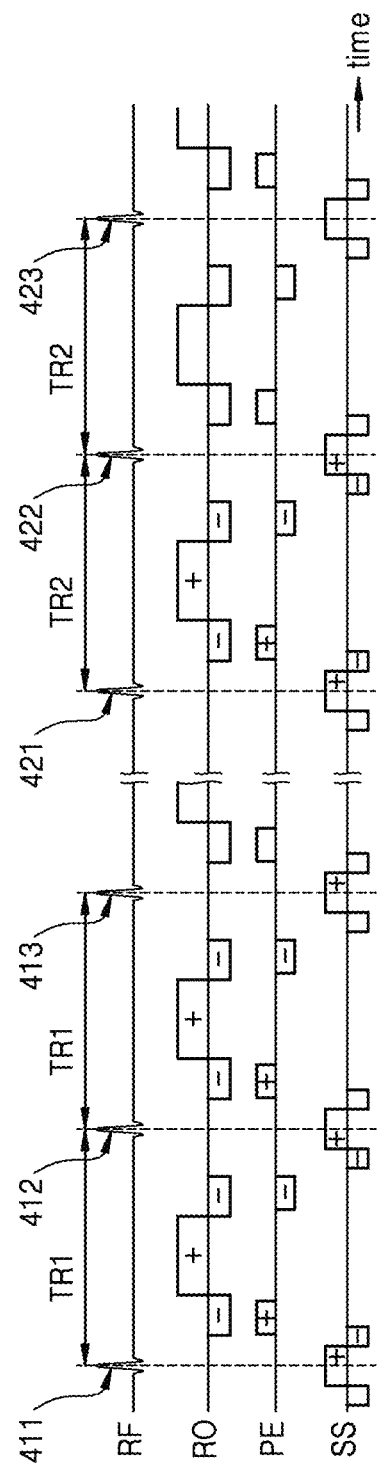
FIG. 6 is a pulse sequence schematic diagram according to an exemplary embodiment.

FIG. 6 is a pulse sequence schematic diagram according to an exemplary embodiment.

Referring to FIG. 6, a plurality of RF pulses 411, 412, 413, 421, 422, and 423 in a pulse sequence may be separated by first repetition time TR1 and second repetition time TR2.

Here, the pulse sequence may be designed so that RF pulses 411 through 413 are applied at intervals of the first repetition time TR1, and when a predetermined condition is satisfied RF pulses 421 through 423 are applied at intervals of the second repetition time TR2. While FIG. 6 shows a limited number of RF pulses 411 through 413 and 421 through 423, more RF pulses than those shown in FIG. 6 may be applied at intervals of the first repetition time TR1 and intervals of the second repetition time TR2.

The pulse sequence schematic diagram may include an RF pulse, a readout gradient RO, a phase encoding gradient PE, and a slice selection gradient SS, all of which are based on a steady-state free procession (SSFP) sequence. Here, the readout gradient (RO) may also be referred to as a frequency encoding gradient.

According to an exemplary embodiment, the MRI apparatus 100 may control a gradient coil according to a steady-state free procession (SSFP) technique. The SSFP technique is a technique for obtaining an MR image by using a steady state and may include a gradient sequence for refocusing a dephased MR signal after an RF pulse is transmitted.

Here, the MRI apparatus 100 may control the sum of moments of gradients applied to an object during one repetition time TR to be constant. For example, the MRI apparatus 100 may control the sum of moments of gradients applied to the object during each repetition time TR to be "0" or approximate "0". For example, referring to FIG. 6, in each of the readout gradient RO, the phase encoding gradient PE, and slice selection gradient SS, the sum of moments of gradients indicated by 'plus sign (+)' and moments of gradients indicated by 'minus sign (−)' may be "0".

Thus, the gradient magnetic field controller may apply a gradient sequence to the object according to a SSFP or balanced SSFP (bSSFP) technique.

The bSSFP pulse sequence is illustrated in FIG. 6, but another pulse sequence may be used according to exemplary embodiments. For example, gradient echo (GE), spin echo (SE), inversion recovery (IR), short T1 inversion recovery (STIR), Fast spin echo (FSE), Turbo spin echo (TSE), Spoiled Gradient Recalled Echo (SPGR), Fast Low Angle Shot (FLASH), Gradient Recalled Acquisition in the Steady State (GRASS), Fast Imaging with Steady State Precession (FISP), Reverse Fast Imaging with Steady-state Precession (PSIF), or a combination thereof may be used for the pulse sequences.

The data acquisition unit 120 may receive an MR signal emitted from the object via the RF coil (26 of FIG. 1).

The MR signal acquired by the data acquisition unit 120 may include a FID signal and an echo signal. When a gradient is applied based on a SSFP sequence, echo signals may be generated at intervals of time to echo TE that is equal or close to repetition time TR.

The data acquisition unit 120 may also undersample the received MR signal to acquire the undersampled MR signal. Furthermore, the image processor 130 may create K-space data by using the undersampled MR signal and generate an MR image of the object by performing Fourier transformation on the created K-space data.

Figure 7:
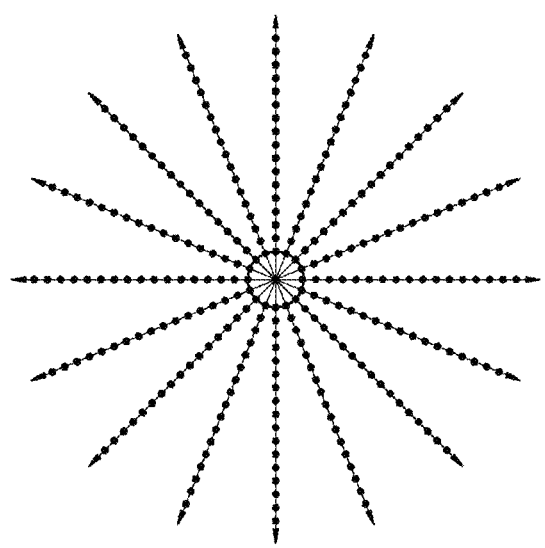
FIG. 7 is a diagram for explaining sampling of an MR signal in a three-dimensional (3D) K-space.

FIG. 7 is a diagram for explaining sampling of an MR signal in a 3D K-space.

The data acquisition unit 120 of the MRI apparatus 100 may acquire MR signals along eight (8) spokes, as shown in FIG. 7, on a radial trajectory in K-space. According to an exemplary embodiment, the number of spokes on a radial trajectory in K-space is not limited to 8 and may be more or less than 8. Furthermore, a space between adjacent spokes may lie in different ranges.

FIG. 7 illustrates that MR signals are acquired along points on a radial trajectory, but exemplary embodiments are not limited thereto. Various trajectories such as a spiral trajectory or a variable density spiral trajectory may be used for undersampling.

Figure 8:
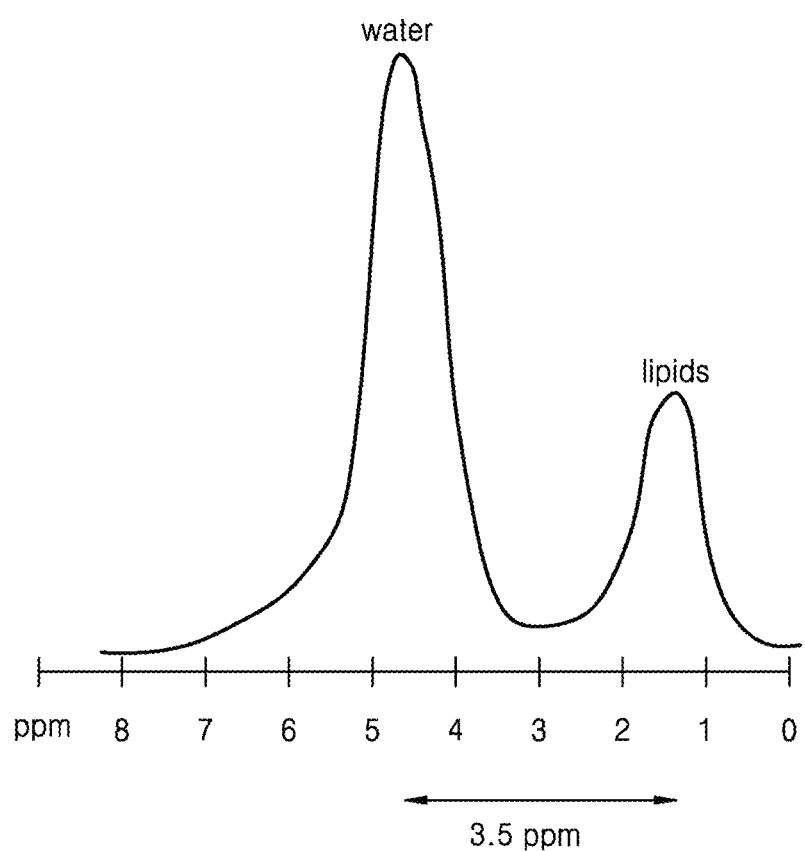
FIG. 8 is a diagram for explaining a chemical shift between water and lipids.

FIG. 8 is a diagram for explaining a chemical shift between water and lipids.

Resonant frequency of the same type of atomic nucleus in a nuclear magnetic resonance (NMR) spectrum varies depending on a chemical environment around the atomic nucleus, which is called a chemical shift. The chemical shift may be affected by a status of bonding between atoms or anisotropy in magnetic susceptibility of neighboring substituents.

For example, referring to FIG. 8, both water and fat contain hydrogen atoms but their resonant frequencies are 3.5 parts per million (ppm) apart. At a magnetic field strength of 3 T, a difference between resonant frequencies of the water and fat is about 440 Hz. At a magnetic field strength of 1.5 T, a difference between resonant frequencies of the water and fat may be about 220 Hz.

$$\Phi_{off} = 2\pi \Delta f_{off} TE \quad (1)$$

where $\Phi_{off}$, $\Delta f_{off}$, and TE respectively denote a phase difference between MR signals of water and fat, a difference between resonant frequencies of the water and fat, and time to echo. Since the difference $\Delta f_{off}$ between resonant frequencies of the water and fat is determined according to a magnetic field strength, the phase difference $\Phi_{off}$ between MR signals of the water and fat may be determined by adjusting the time to echo TE.

For example, at a magnetic field strength of 3 T, a difference between resonant frequencies of water and fat may be about 440 Hz. Here, when the time to echo TE is about 1.13 ms, a phase difference $\Phi_{off}$ between MR signals of the water and fat is Tr. Thus, every 1.13 ms MR signals of the water and fat are alternately in-phase and out-of-phase.

When a bSSFP gradient sequence is applied, repetition time TR is twice the time to echo TE and may be about 2.3 ms. MR signals of fat and water are out-of-phase at an odd number multiple of the repetition time TR, and in-phase at an even number multiple of the repetition time TR.

Thus, when an object includes water and fat, to increase the orthogonality between MR signals of the water and fat, a plurality of RF pulses, which are separated by a repetition time determined so that MR signals of the water and fat are in-phase and another repetition time determined so that the MR signals from the water and fat are out-of-phase, may be applied to the object.

For example, if the object includes water and fat, to increase the orthogonality between the water and fat, the first repetition time TR1 may be at least one of about 4.6 ms, about 9.2 ms, about 13.8 ms, . . . , and about 2.3 ms×(2n) where n is a natural number, while the second repetition time TR2 may be at least one of about 6.9 ms, about 11.5 ms, about 16.1 ms, . . . , and about 2.3 ms×(2n+1) where n is a natural number.

For example, the first repetition time TR1 and the second repetition time TR2 may be about 4.6 ms and about 6.9 ms, respectively.

According to an exemplary embodiment, a plurality of RF pulses may be separated by the first, the second, and the third repetition times. Here, the third repetition time TR3 may be longer than the first repetition time TR1 and may be at least one of about 4.6 ms, about 9.2 ms, about 13.8 ms, . . . , and about 2.3 ms×(2n) where n is a natural number.

For example, the first, the second, and the third repetition times may be about 4.6 ms, about 6.9 ms, and 9.2 ms, respectively.

According to an exemplary embodiment, a plurality of RF pulses may be separated by the first, the second, and the fourth repetition times. Here, the fourth repetition time TR4 may be longer than the second repetition time TR2 and may be at least one of about 6.9 ms, about 11.5 ms, about 16.1 ms, . . . , and about 2.3 ms×(2n+1) where n is a natural number.

For example, the first, the second, and the fourth repetition times may be about 4.6 ms, about 6.9 ms, and about 11.5 ms, respectively.

According to an exemplary embodiment, a plurality of RF pulses may be separated by the first, the second, the third, and the fourth repetition times. Here, the first, the second, the third, and the fourth repetition times may be about 4.6 ms, about 6.9 ms, about 9.2 ms, and about 11.5 ms, respectively.

Water and fat are taken as an example hereinbefore, but the above-described method may be used to increase orthogonality between MR signals of various materials.

According to an exemplary embodiment, a plurality of RF pulses may be separated by a number (n) of repetition times including the first repetition time and the second repetition time. Here, n repetition times may be determined in order to increase the orthogonality between first and second MR signals. For example, n repetition times may be determined so that the first and second MR signals have a phase difference of $(2\pi k)/n$ with respect to each other where k is each of the natural numbers from 1 to n. When the plurality of RF pulses are separated by three repetition times, the first and second MR signals may have a phase difference of $(2\pi)/3$, $(4\pi)/3$, or $2\pi$ by each of the three repetition times. As another example, when the plurality of RF pulses are separated by two repetition times, i.e., by first and second repetition times, the first and second MR signals may have a phase difference of $\pi$ or $2\pi$.

By applying to the object a plurality of RF pulses separated by a repetition time determined so that MR signals of two materials are in-phase and another repetition time determined so that the MR signals of two materials are out-of-phase, orthogonality between the MR signals of the two materials may be increased, which makes it easier to separate and process the MR signals of the two materials.

Figure 9:
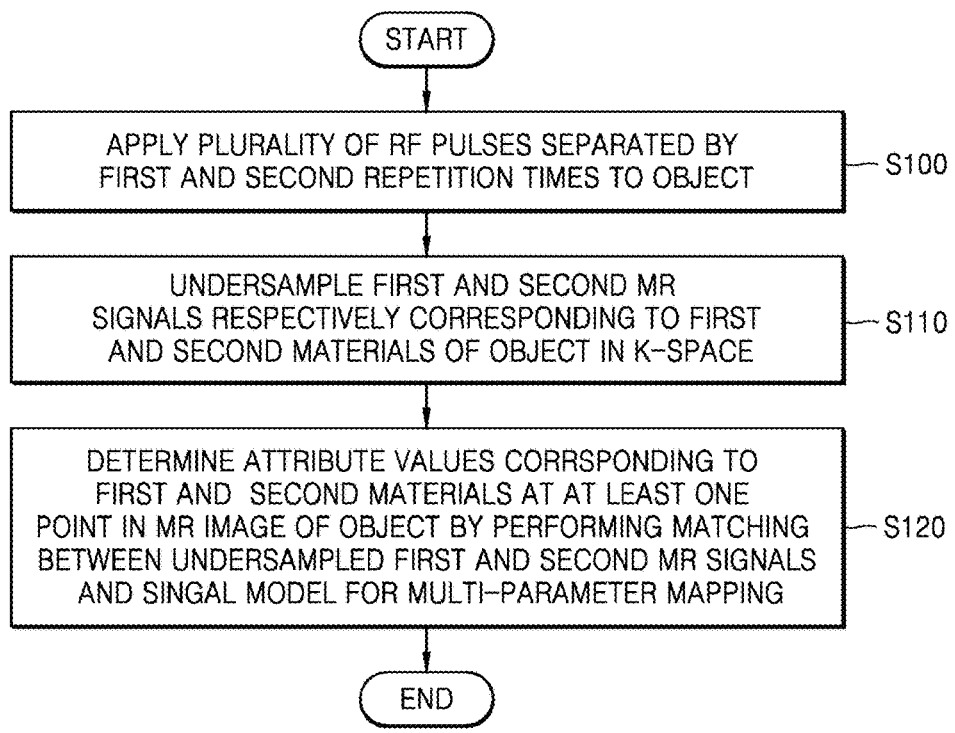
FIG. 9 is a flowchart of a method of quantifying properties of an object via MRI, according to an exemplary embodiment.

FIG. 9 is a flowchart of a method of quantifying properties of an object via MRI, according to an exemplary embodiment.

The MRI apparatus 100 applies a plurality of RF pulses that are separated by first and second repetition times to an object (S100).

After protons in the object are excited by an applied RF pulses, the protons emit MR signals transiting to a lower energy state. The object includes first and second materials, and protons included in the first and second materials emit MR signals transiting to a lower energy state after excited by an RF pulse.

The first and second repetition times are determined based on the first and second materials in the object.

The first and second repetition times are determined based on the first and second materials in order to increase orthogonality between first MR signals corresponding to the first material and second MR signals corresponding to the second material.

To increase the orthogonality between the first and second MR signals, the first repetition time may be determined so that the first and second MR signals are in-phase, and the second repetition time may be determined so that the first and second MR signals are out-of-phase.

The MR apparatus 100 may receive emitted MR signals.

The MRI apparatus 100 undersamples first MR signals corresponding to a first material and second MR signals corresponding to a second material to acquire the undersampled first and second MR signals (S110).

The MRI apparatus 100 may acquire MR signals corresponding to points shown as dots on a radial trajectory in K-space.

The MRI apparatus 100 may determine attribute values corresponding to the first and second materials at at least one point in an MR image of the object by performing matching between the undersampled first and second MR signals acquired in operation S110, and a signal model for MR fingerprinting (S120).

The signal model for MR fingerprinting stores predicted signal evolutions. An undersampled MR signal and the signal model for MR fingerprinting may be pattern matched based on pattern recognition, an entry most similar to the undersampled MR signal is selected from among the signal evolutions stored in the signal model, and attribute values corresponding to the selected entry are determined as the attribute values corresponding to the first and second materials at a point in the MR image of the object.

For example, the matching is performed based on Equation (2) below:

$$\mathrm{argmin}_{F,wT1,wT2,fT1,fT2,delB,coilphase} \| Sig - (wD(x,delB) + fD(x,delB+440 \text{ Hz})) \| \quad (2)$$

where F is fractions of water and fat in a voxel, wT1 and wT2 are T1 and T2 corresponding to water within the voxel, fT1 and fT2 are T1 and T2 corresponding to fat within the voxel, delB ($\Delta$B) is off-resonance between the water and fat, and coilphase is a value determined by a coil phase effect.

Furthermore, Sig is an acquired MR signal, wD (x, $\Delta$B) is a water signal model, and fD (x, $\Delta$B+440 Hz) is a fat signal model. The water signal model is a model simulated using Bloch equation as a function of wT1, wT2, and $\Delta$B. The fat signal model is simulated using Bloch equation as a function of fT1, fT2, $\Delta$B, and a chemical shift of 440 Hz.

In other words, when variables such as F, wT1, wT2, fT1, fT2, $\Delta$B, and coilphase vary, in the signal model, an entry having the smallest difference between the sum of wD (x, $\Delta$B) and fD (x, $\Delta$B+440 Hz) and the acquired MR signal may be determined.

For example, the attribute value corresponding to the first and second materials may be fractions of the first and second materials, T1 and T2 of the first material, T1 and T2 of the second material, or off-resonance between the first and second materials.

The attribute values corresponding to the first and second materials at each voxel in an MR image is determined so that the MR image may be shown as a map of the attribute values. For example, the MR image may be fraction maps of the first and second materials, T1 and T2 maps of the first material, T1 and T2 maps of the second material, a map of off-resonance between the first and second materials, or a B1 phase map of the object, but is not limited thereto.

According to an exemplary embodiment, attribute values corresponding to a plurality of materials in the object at each voxel in an MR image are determined simultaneously, so that various parameters may be effectively quantified by a single scan.

By performing matching between MR signals and a signal model prestoring predicted signal evolutions, attribute values corresponding to the first and second materials at a point within an MR image of the object are determined, and the MRI apparatus 100 may thereby generate quantitative maps respectively corresponding to attribute values.

First Experiment

Experimental data derived from a first experiment will now be described.

Figure 10:
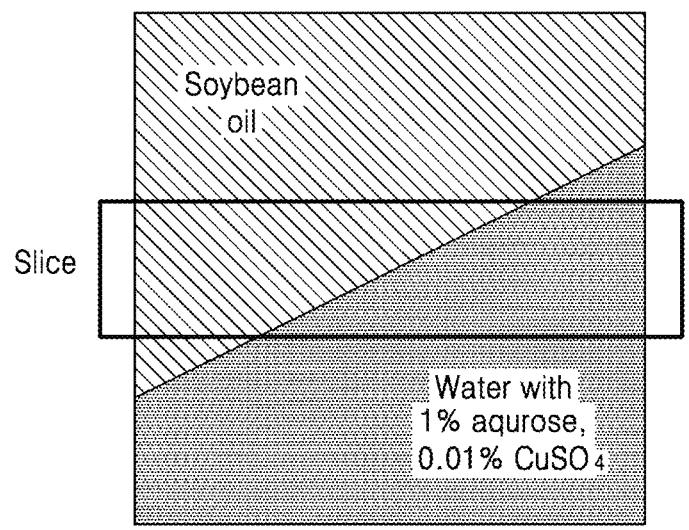
FIG. 10 is a side view of a phantom used in first and second experiments.

FIG. 10 is a side view of a phantom used in first and second experiments.

As shown in FIG. 10, the phantom used in the first and second experiments is composed of soybean oil and water containing 1% agarose and 0.01% copper sulfate ($CuSO_4$). As an interface between water and soybean oil is tilted as shown in FIG. 10, gradients of the soybean oil and water in a selected slice vary along a transverse axis.

Figure 11A:
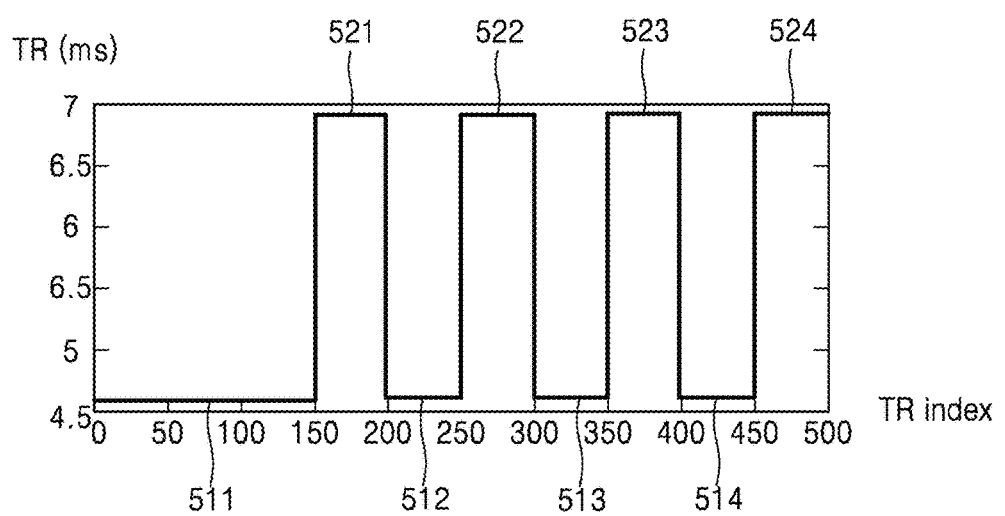
FIG. 11A is an example of a repetition time pattern.

FIG. 11A is an example of a repetition time pattern.

Figure 11B:
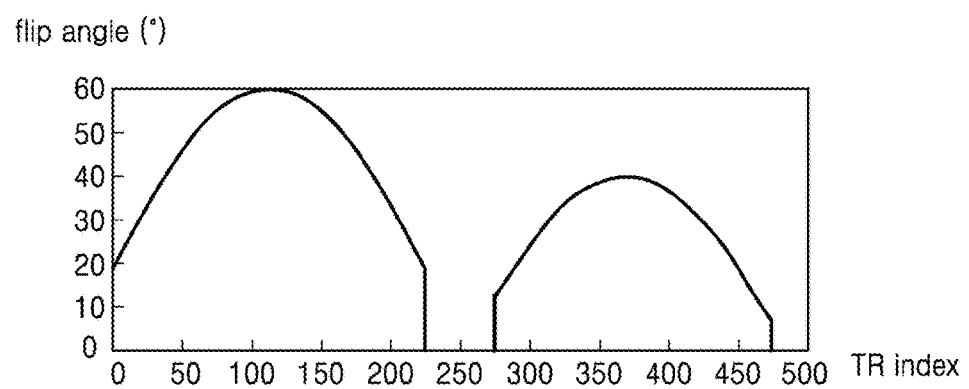
FIG. 11B is an example of a flip angle pattern.

FIG. 11B is an example of a flip angle pattern.

As shown in FIG. 11A, in the first experiment, a plurality of RF pulses may be separated by first intervals 511 through 514 during which a first repetition time TR1 is repeated a plurality of times and second intervals 521 through 524 during which a second repetition time TR2 is repeated a plurality of times.

Here, as shown in FIG. 11A, the first intervals 511 through 514 and the second intervals 521 through 524 may be alternately repeated.

As described above, when the object includes water and fat, to increase the orthogonality between the water and fat, the first repetition time TR1 may be at least one of about 4.6 ms, about 9.2 ms, about 13.8 ms, . . . , and about 2.3 ms×(2n) where n is a natural number, while the second repetition time TR2 may be at least one of about 6.9 ms, about 11.5 ms, about 16.1 ms, . . . , and about 2.3 ms×(2n+1) where n is a natural number.

Referring to FIG. 11A, in the first experiment, the first repetition time TR1 is about 4.6 ms, and the second repetition time TR2 is about 6.9 ms.

In the first experiment, the first interval 511 is an interval during which the first repetition time TR1 is repeated 150 times, and each of the remaining first intervals 512 through 514 is an interval during which the first repetition time TR1 is repeated 50 times. Each of the second intervals 521 through 524 is an interval during which the second repetition time TR2 is repeated 50 times. In this way, the number of times that the first repetition time TR1 is repeated during each of the first intervals 512 through 514 may be equal to the number of times that the second repetition time TR2 is repeated during each of the second intervals 521 through 524. However, like in the first interval 511, the first repetition time TR1 may be repeated more times than the second repetition time TR2 in the second intervals 521 through 524.

In the first experiment, RF pulses are applied based on a bSSFP-based pulse sequence, and a flip angle pattern shown in FIG. 11B occurs.

In addition, when the bSSFP-based pulse sequence is used, banding artifacts occur at 1/TR (Hz).

However, when the repetition time pattern shown in FIG. 11A is used, a signal profile is repeated every 1/TR Hz, and thus a signal level is increased.

FIGS. 12A through 12D are graphs of signals acquired according to the first experiment.

Figure 12A:
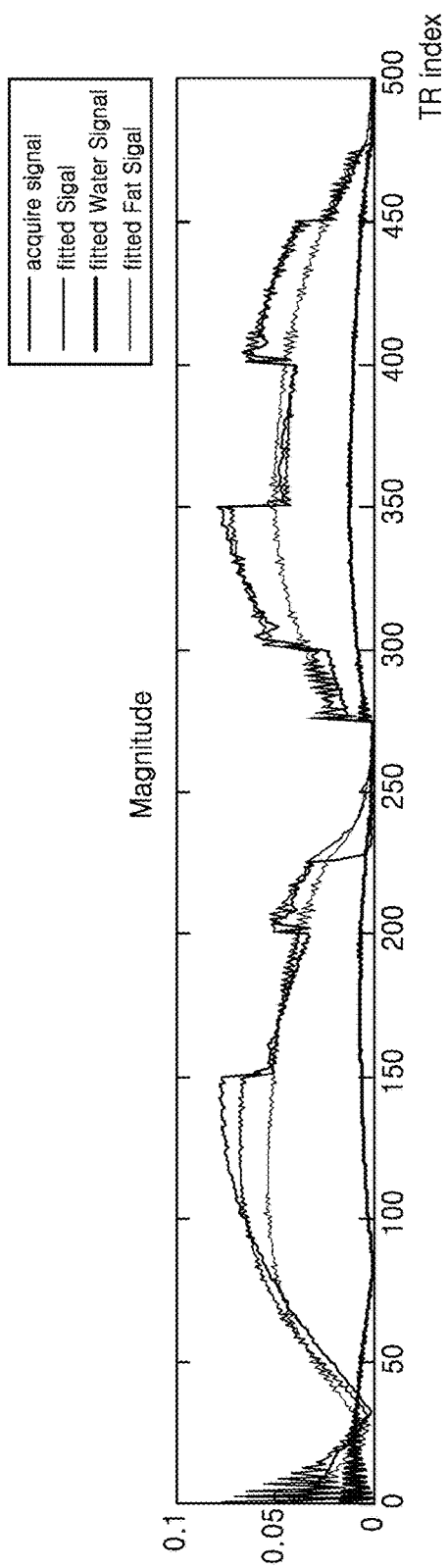
FIGS. 12A, 12B, 12C, and 12D are graphs of signals acquired according to the first experiment.

As shown in FIG. 12A, a signal selected as the most similar one to an acquired MR signal from a signal model has a signal evolution similar to the acquired MR signal.

Figure 12B:
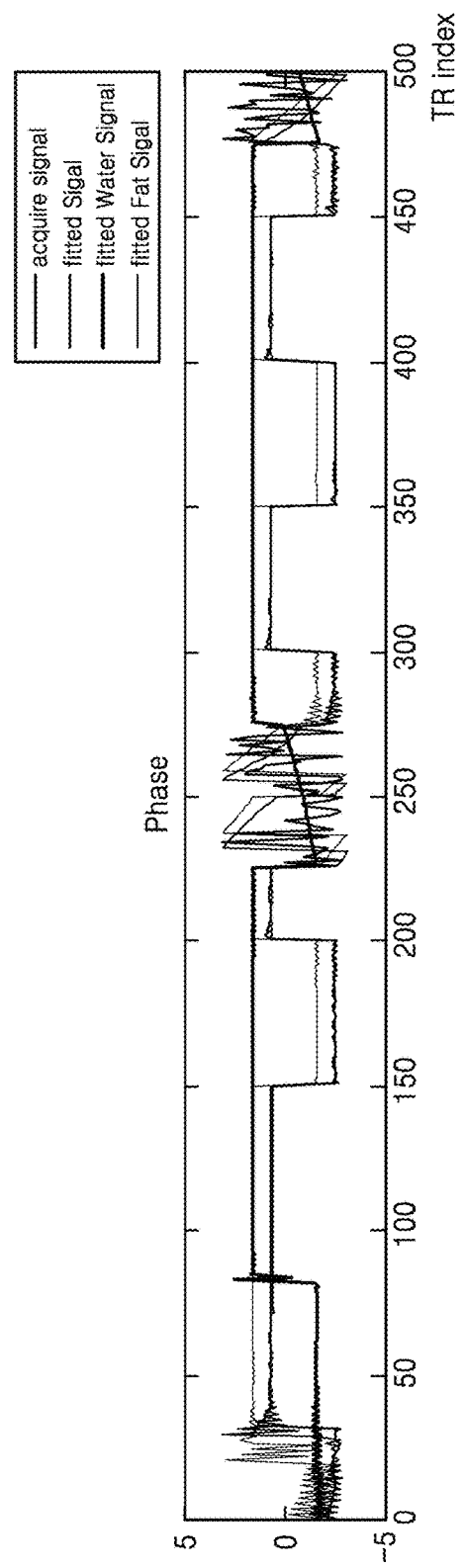

As described above, the orthogonality between water and fat increases so that water and fat signals selected from a signal model exhibit the largest phase difference when they are out-of-phase and the smallest phase difference when they are in-phase as shown in FIG. 12B.

Figure 12C:
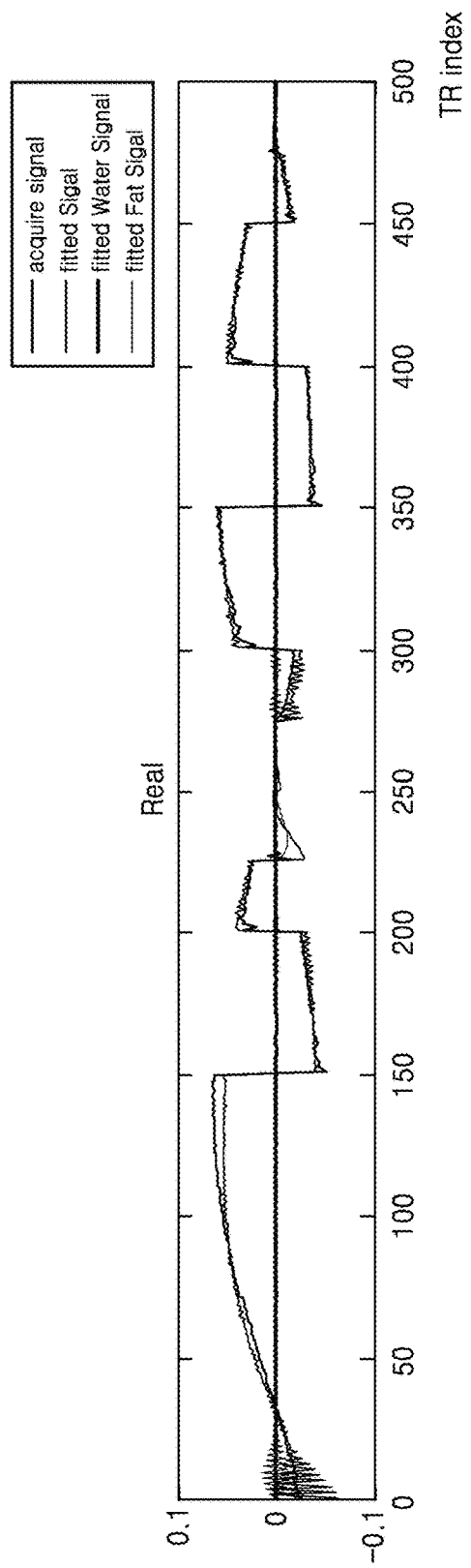
Figure 12D:
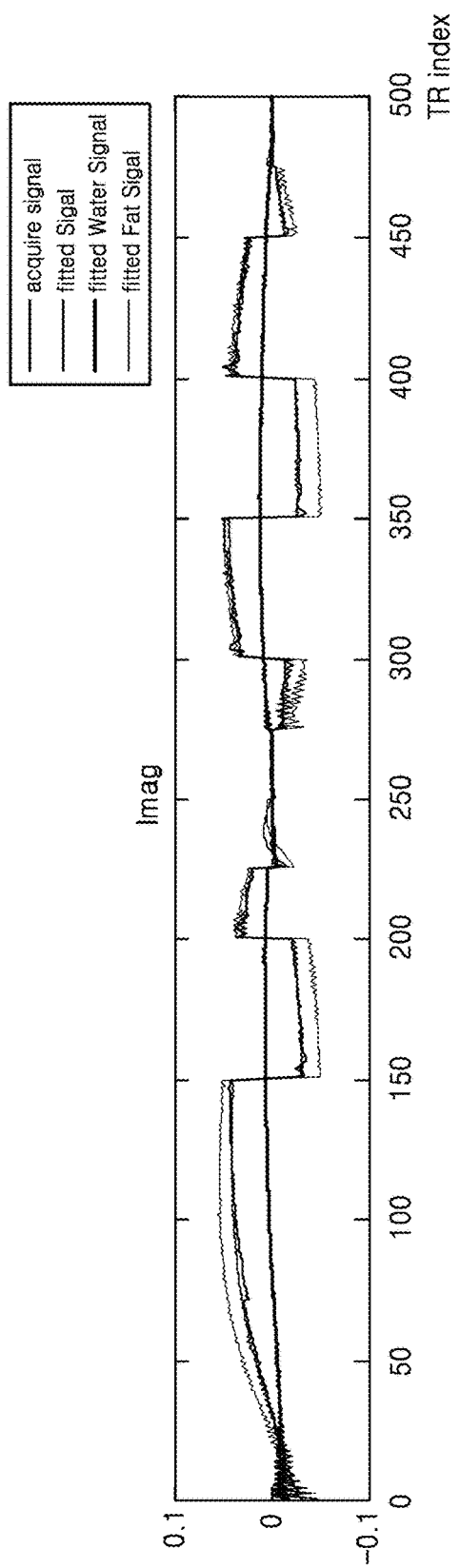

FIG. 12C shows the real part of signals, and FIG. 12D shows the imaginary part of the signals.

Figure 13A:
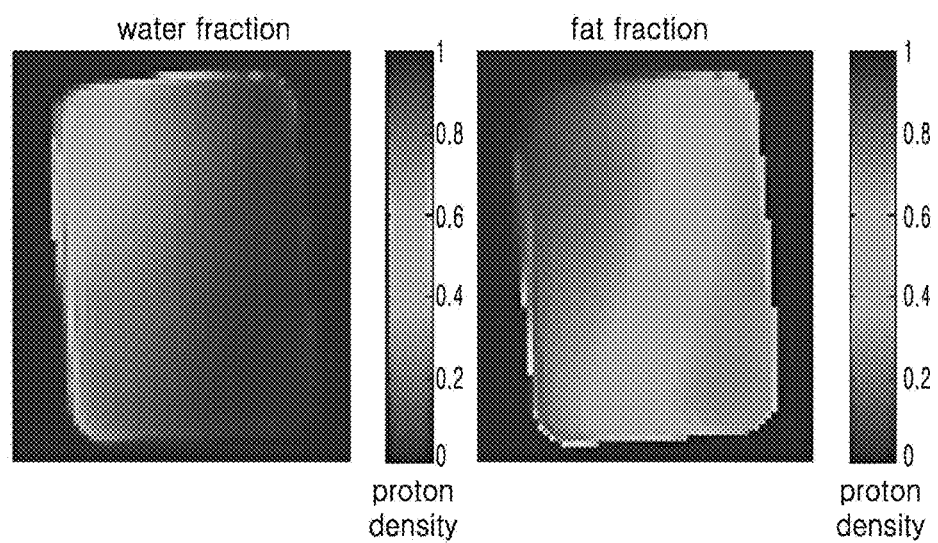
FIG. 13A shows proton density maps of water and fat in a phantom, obtained according to the first experiment.
Figure 13B:
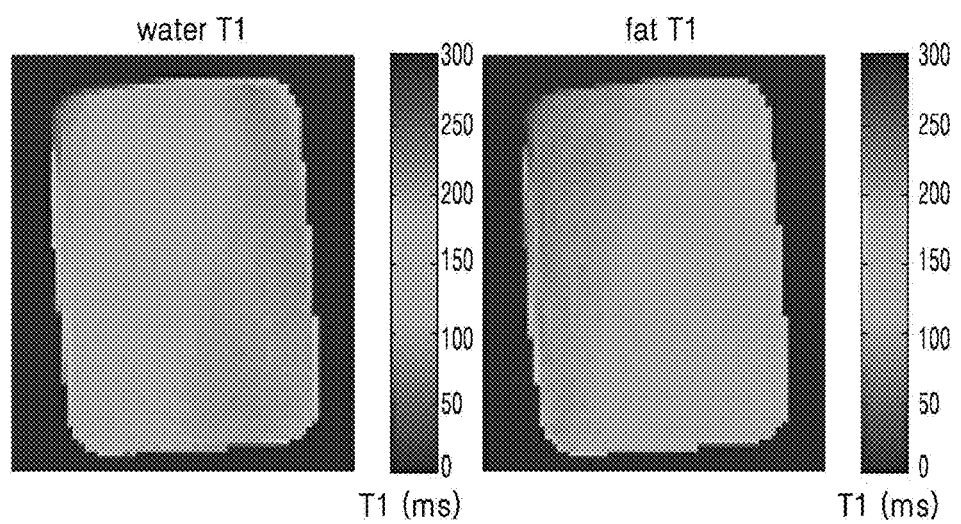
FIG. 13B illustrates T1 maps of water and fat in a phantom, obtained according to a first experiment.
Figure 13C:
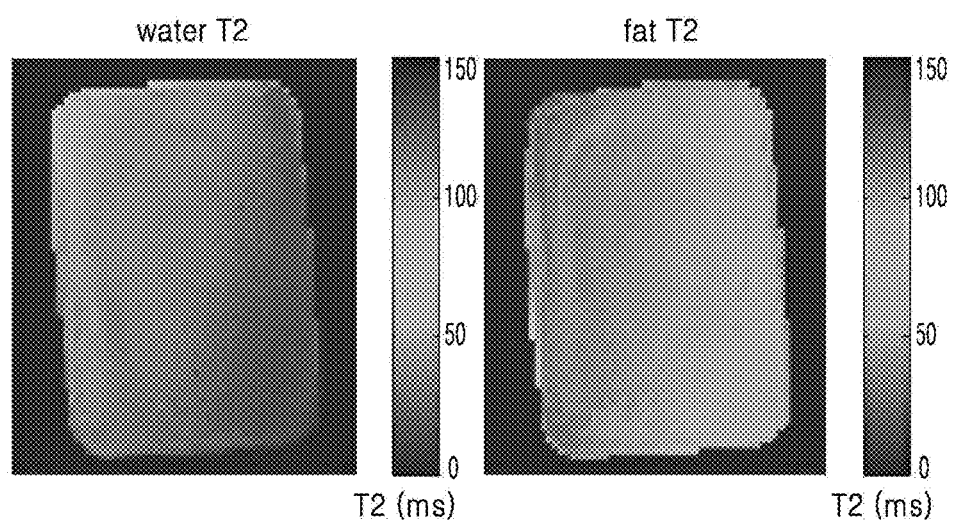
FIG. 13C illustrates T2 maps of water and fat in a phantom, obtained according to the first experiment.
Figure 13D:
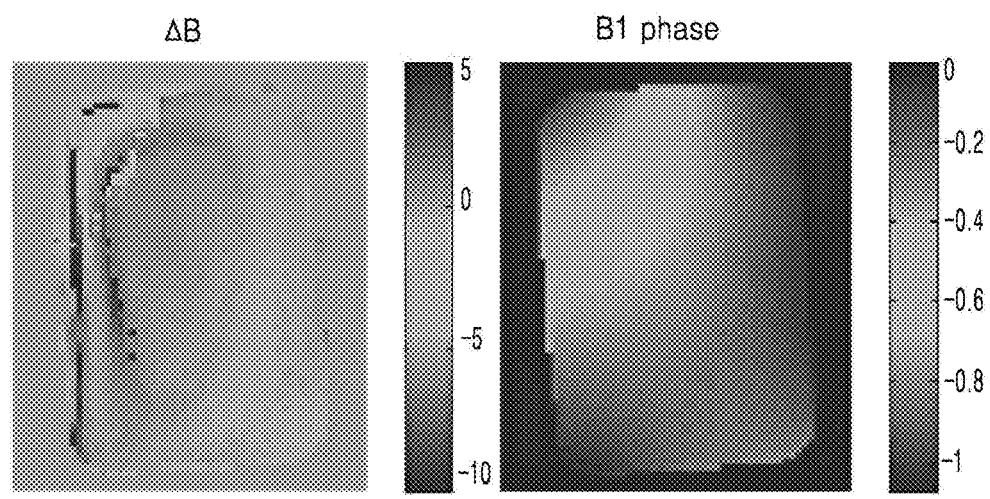
FIG. 13D illustrates an off-resonance map and a B1 phase map of a phantom, obtained according to the first experiment.
Figure 14A:
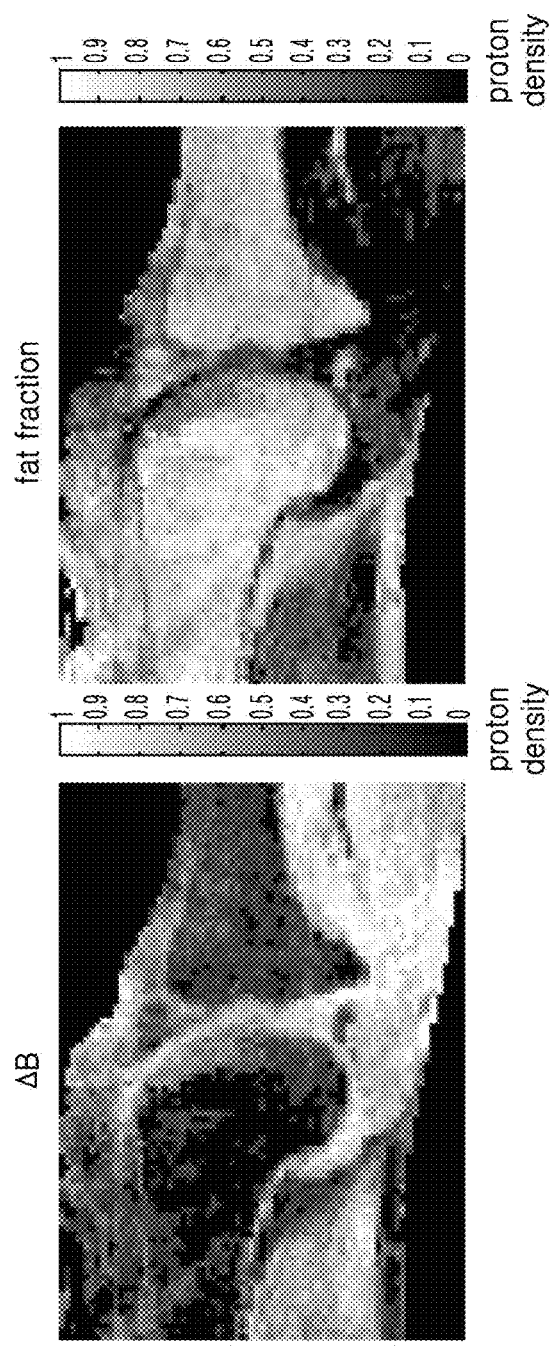
FIG. 14A shows proton density maps of water and fat in a biological object, obtained according to the first experiment.
Figure 14B:
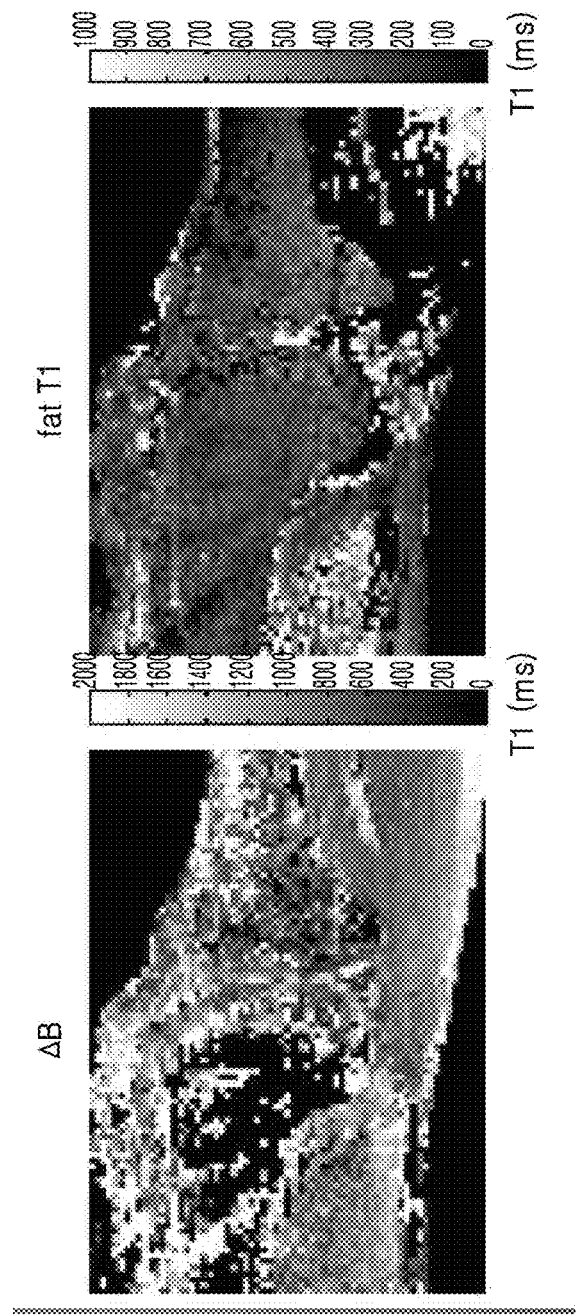
FIG. 14B illustrates T1 maps of water and fat in a biological object, obtained according to the first experiment.
Figure 14C:
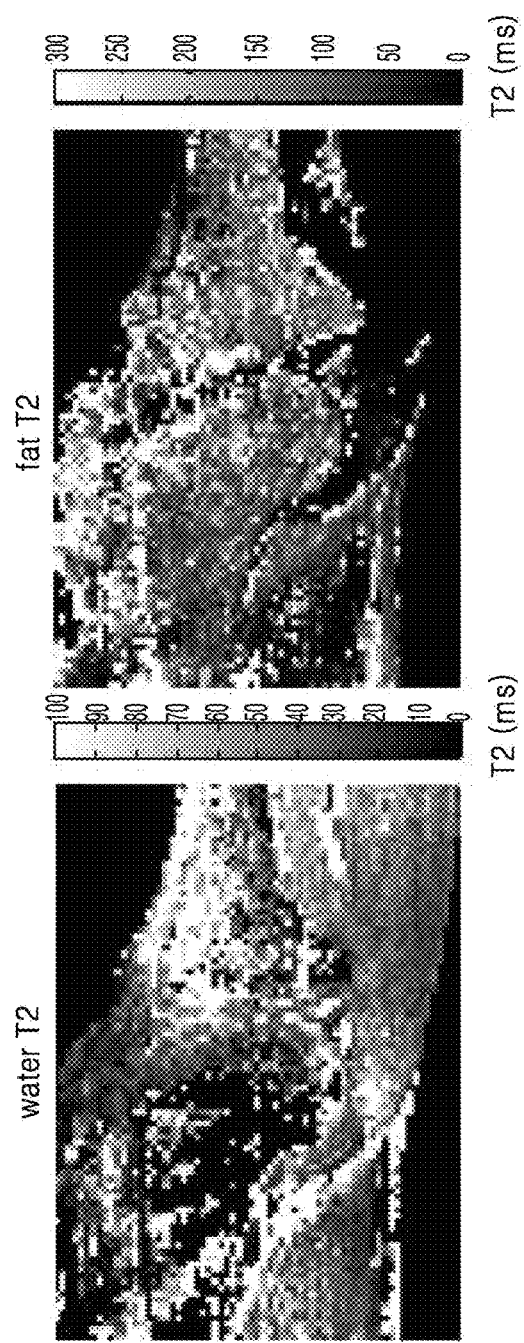
FIG. 14C illustrates T2 maps of water and fat in a biological object, obtained according to the first experiment.
Figure 14D:
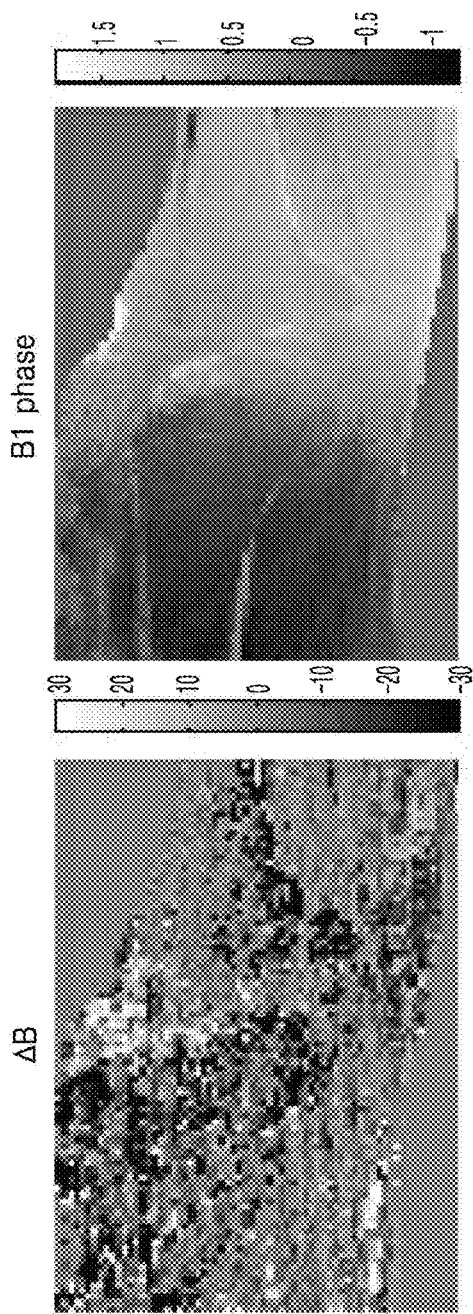
FIG. 14D illustrates an off-resonance map and a B1 phase map of a biological object, obtained according to the first experiment.

Attribute values corresponding to first and second materials in each voxel within an MR image are determined, so that the MR image may be shown as a map of the attribute values. For example, the MR image may be shown as a proton density map of water or fat in a phantom as shown in FIG. 13A, a T1 map of the water or the fat in the phantom as shown in FIG. 13B, a T2 map of the water or the fat in the phantom as shown in FIG. 13C, or an off-resonance map or a B1 phase map of the phantom as shown in FIG. 13D.

Furthermore, as shown in FIGS. 14A through 14D, the MR image may also be generated for a biological object as a map of various attribute values. FIG. 14E is a table showing various attribute values determined for a biological object.

The first experiment took 24 seconds per slice to scan an object on a radial trajectory in K-space as described with reference to FIG. 7 under conditions of a matrix of 128×128 and a slice thickness of 5 mm.

As shown in FIGS. 13A through 13D and FIGS. 14A through 14E, according to an exemplary embodiment, use of multi-parameter mapping allows simultaneous quantification of various parameters in a shorter time than a conventional imaging technique.

Second Experiment

Experimental data obtained from a second experiment will now be described. In the second experiment, the phantom shown in FIG. 10 was used.

Figure 15A:
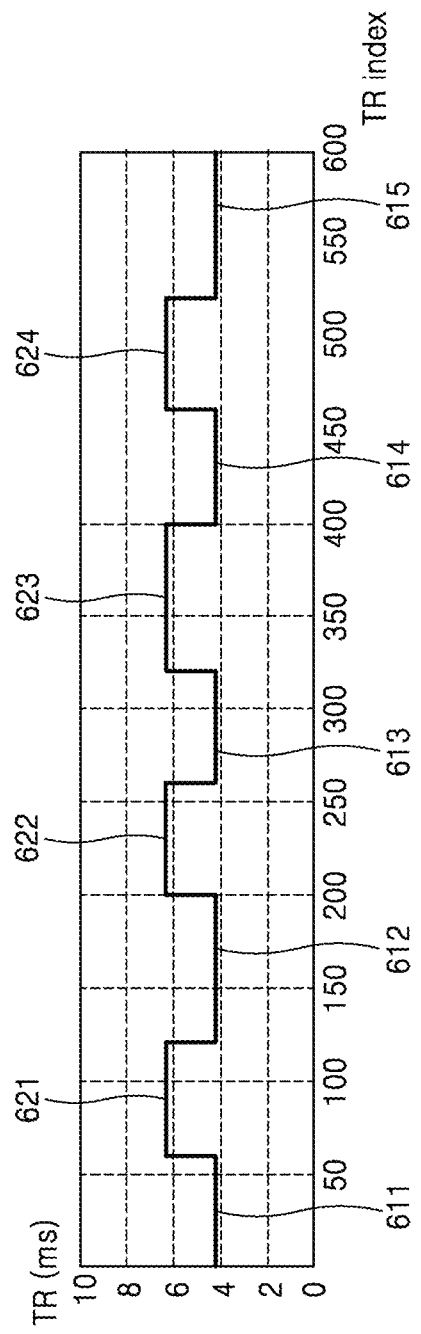
FIG. 15A is another example of a repetition time pattern.
Figure 15B:
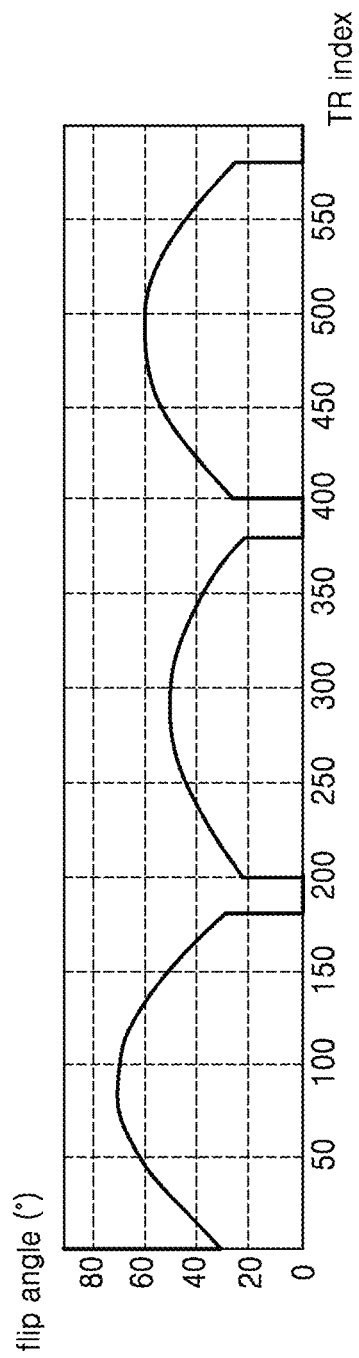
FIG. 15B is another example of a flip angle pattern.

FIG. 15A is another example of a repetition time pattern.
FIG. 15B is another example of a flip angle pattern.

As shown in FIG. 15A, in the second experiment, a plurality of RF pulses may be separated by first intervals 611 through 615 during which a first repetition time TR1 is repeated a plurality of times and second intervals 621 through 624 during which a second repetition time TR2 is repeated a plurality of times.

Here, as shown in FIG. 15A, the first intervals 611 through 615 and the second intervals 621 through 624 may be alternately repeated.

As described above, when the object includes water and fat, to increase the orthogonality between the water and fat, the first repetition time TR1 may be at least one of about 4.6 ms, about 9.2 ms, about 13.8 ms, . . . , and about 2.3 ms×(2n) where n is a natural number, while the second repetition time TR2 may be at least one of about 6.9 ms, about 11.5 ms, about 16.1 ms, . . . , and about 2.3 ms×(2n+1) where n is a natural number.

Referring to FIG. 15A, in the second experiment, the first repetition time TR1 is about 4.6 ms, and the second repetition time TR2 is about 6.9 ms.

In the second experiment, the number of repetitions of the first repetition time TR1 varies in each of the first intervals 611 through 615. The number of repetitions of the second repetition time TR2 varies in each of the second intervals 621 through 624.

In the second experiment, RF pulses are applied based on a bSSFP-based pulse sequence, and a flip angle pattern shown in FIG. 15B occurs.

In addition, when the bSSFP-based pulse sequence is used, banding artifacts occur at 1/TR (Hz).

However, when the repetition time pattern shown in FIG. 15A is used, a signal profile is repeated every 1/TR Hz, and thus a signal level is increased.

Figure 16A:
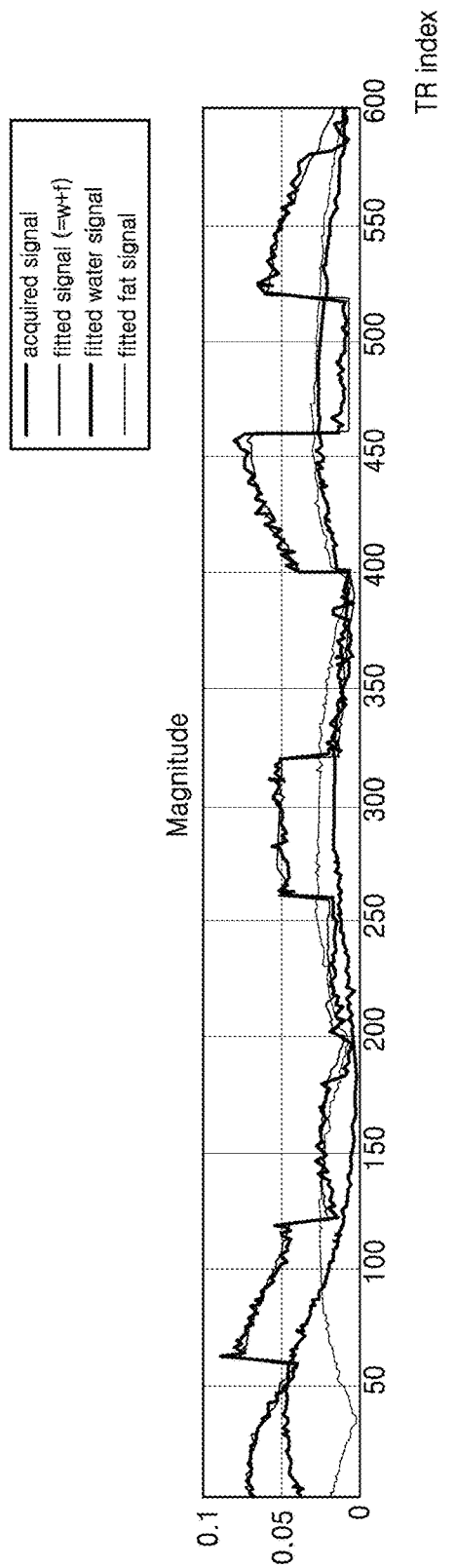
FIGS. 16A, 16B, and 16C are graphs of signals acquired according to a second experiment.
Figure 16B:
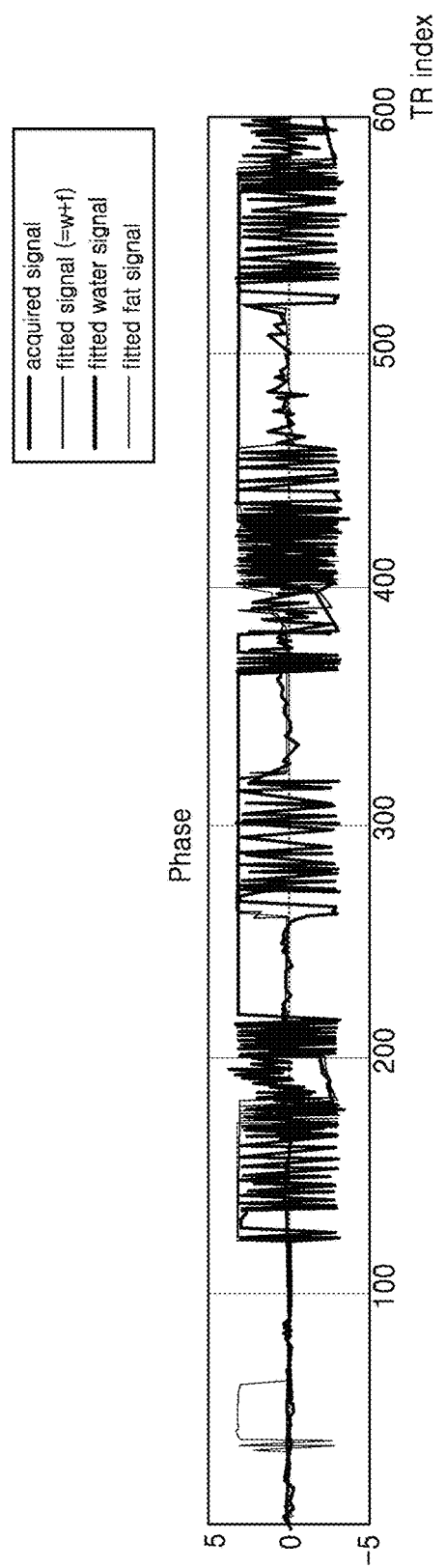
Figure 16C:
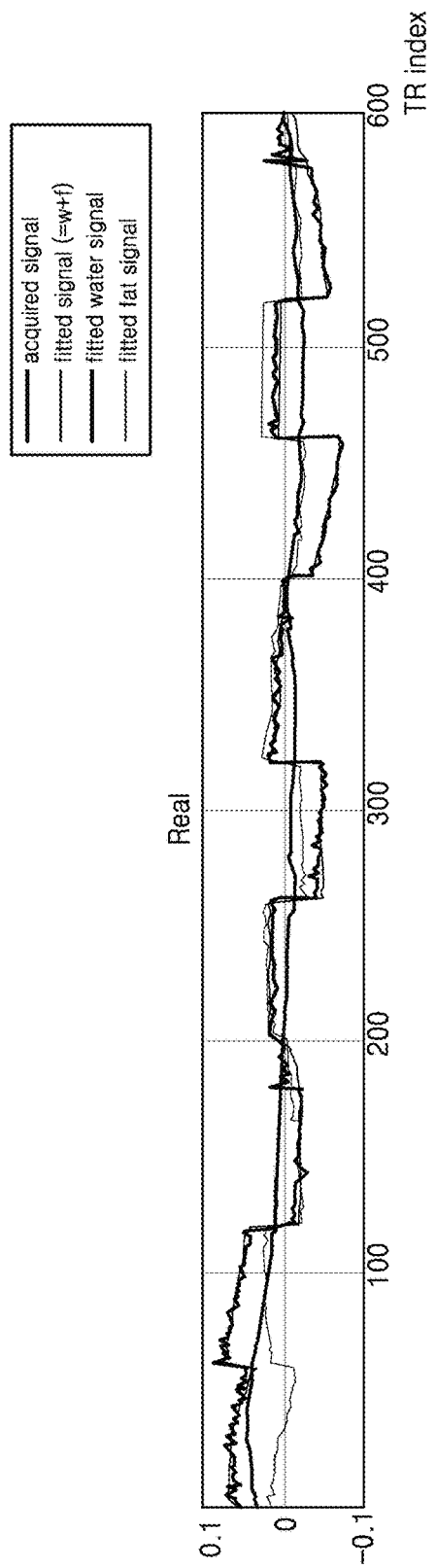

FIGS. 16A through 16C are graphs of signals acquired according to the second experiment.

As shown in FIG. 16A, a signal selected as the most similar one to an acquired MR signal from a signal model has a signal evolution similar to the acquired MR signal.

As described above, the orthogonality between water and fat increases so that in-phase and out-of-phase effects occur. Thus, as shown in FIG. 16B, water and fat signals selected from a signal model exhibit the largest phase difference when they are out of phase and the smallest difference when they are in phase.

FIG. 16C shows the real part of signals.

Figure 17A:
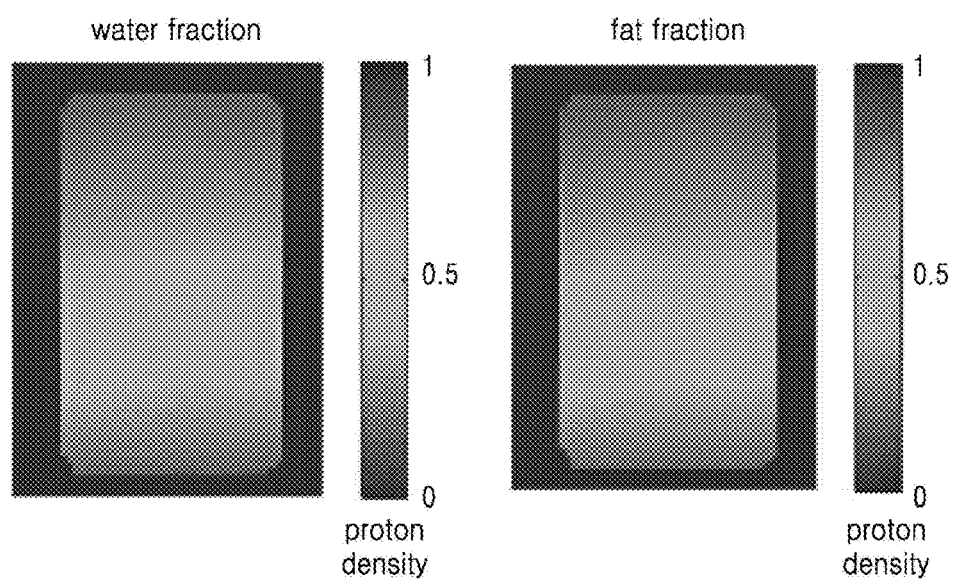
FIG. 17A shows proton density maps of water and fat in a phantom, obtained according to the second experiment.
Figure 17B:
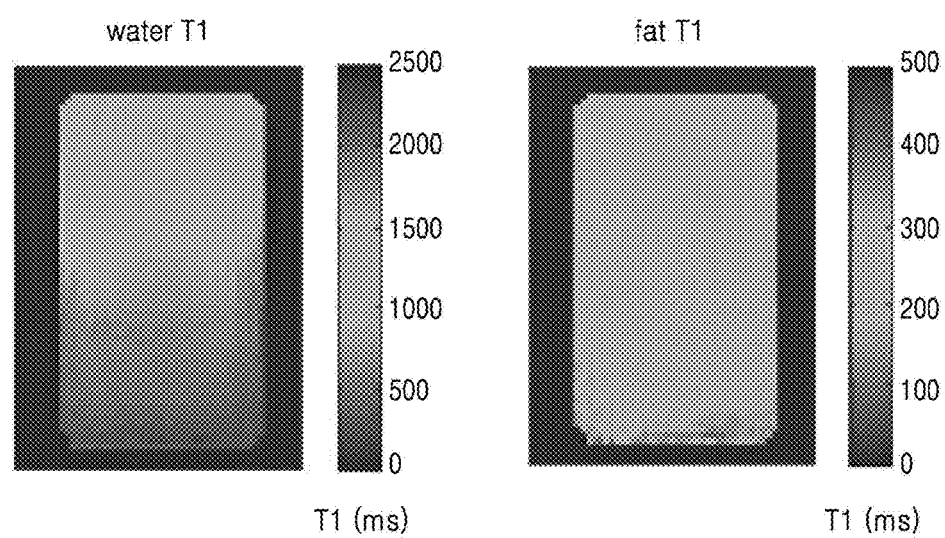
FIG. 17B illustrates T1 maps of water and fat in a phantom, obtained according to the second experiment.
Figure 17C:
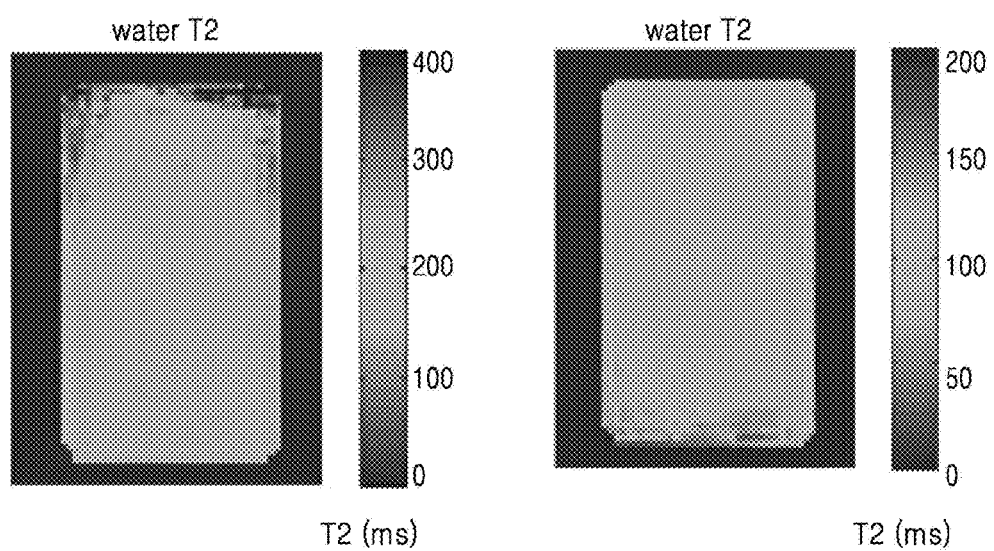
FIG. 17C illustrates T2 maps of water and fat in a phantom, obtained according to the second experiment.

Attribute values corresponding to first and second materials in each voxel within an MR image are determined, so that the MR image may be shown as a map of the attribute values. For example, the MR image may be generated as a proton density map of water or fat in a phantom as shown in FIG. 17A, a T1 map of the water or the fat in the phantom as shown in FIG. 17B, or a T2 map of the water or the fat in the phantom as shown in FIG. 17C.

Figure 18A:
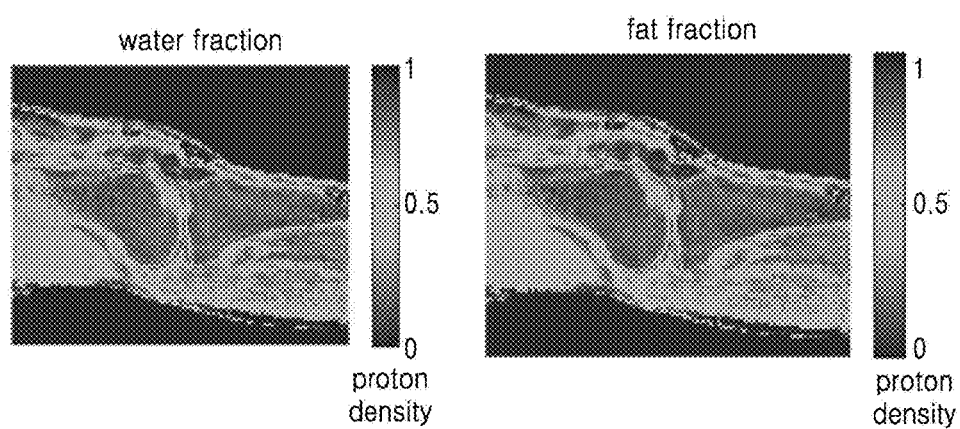
FIG. 18A shows proton density maps of water and fat in a biological object, obtained according to the second experiment.
Figure 18B:
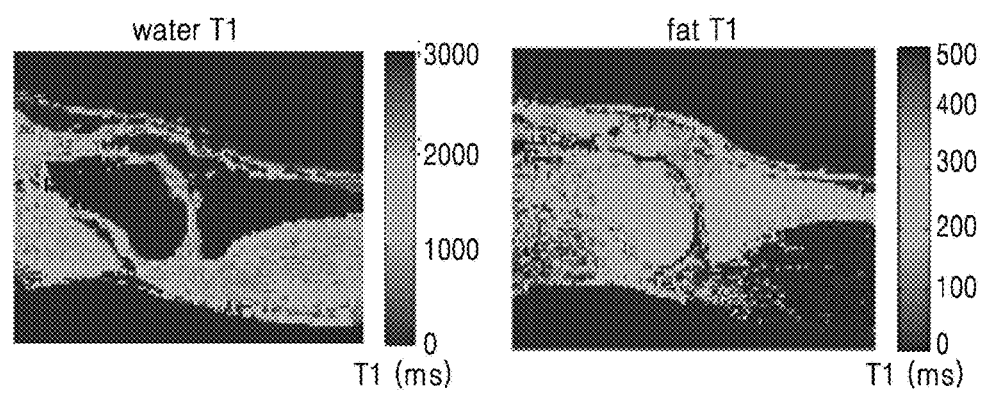
FIG. 18B illustrates T1 maps of water and fat in a biological object, obtained according to the second experiment.
Figure 18C:
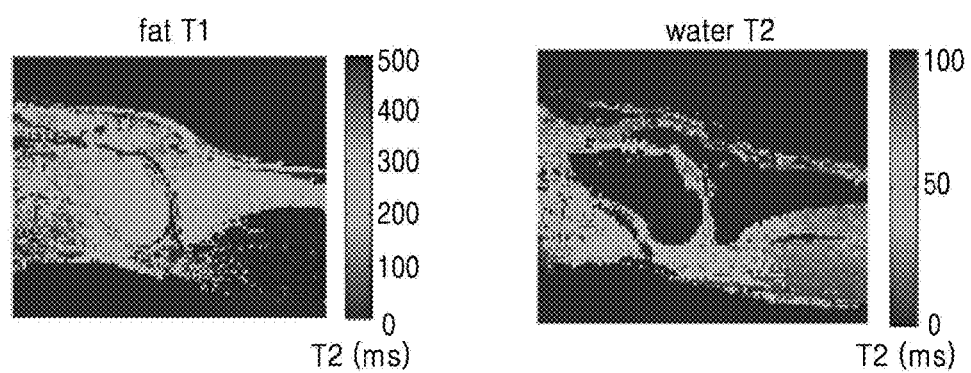
FIG. 18C illustrates T2 maps of water and fat in a biological object, obtained according to the second experiment.

Furthermore, as shown in FIGS. 18A through 18C, the MR image may also be generated for a biological object as a map of various attribute values.

As shown in FIGS. 17A through 17C and 18A through 18C, according to an exemplary embodiment, use of multi-parameter mapping allows quantification of various parameter in a shorter time than an imaging technique according to the related art.

The second experiment took 25 seconds per slice to scan a phantom and 27 seconds per slice to scan a biological object on a radial trajectory in K-space as described with reference to FIG. 7 under conditions of a matrix of 128×128 and a slice thickness of 5 mm.

The embodiments of the present invention can be written as computer programs and can be implemented in general-use digital computers that execute the programs using a computer-readable recording medium.

Examples of the computer-readable recording medium include magnetic storage media (e.g., ROM, floppy disks, hard disks, etc.), optical recording media (e.g., CD-ROMs or DVDs), etc.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of processing a magnetic resonance (MR) image of an object including a first material and a second material on a magnetic resonance imaging (MRI) apparatus by using multi-parameter mapping, the method comprising:
applying to the object a plurality of radio frequency (RF) pulses, each of the plurality of RF pulses being separated from an adjacent RF pulse by either of a first repetition time and a second repetition time;
undersampling first MR signals corresponding to the first material and second MR signals corresponding to the second material in a K-space; and
performing matching between the undersampled first and the undersampled second MR signals and a signal model for the multi-parameter mapping to determine attribute values corresponding to the first and the second materials at at least one point in an MR image of the object,
wherein the plurality of RF pulses have a first interval during which the first repetition time is repeated a first plurality of times and a second interval during which the second repetition time is repeated a second plurality of times.

2. The method of claim 1, wherein the first and the second repetition times are predetermined based on a difference between a resonant frequency of the first material and a resonant frequency of the second material.

3. The method of claim 1, wherein the first repetition time is predetermined so that the first and the second MR signals are in phase, and
wherein the second repetition time is predetermined so that the first and the second MR signals are out of phase.

4. The method of claim 1, wherein the plurality of RF pulses are separated by n repetition times comprising the first and the second repetition times, the n repetition times indicating a number of repetition times.

5. The method of claim 4, wherein the n repetition times are determined so that the first and the second MR signals have a phase difference of $(2\pi k)/n$, and wherein k is a natural number from 1 to n.

6. The method of claim 1, wherein the first and the second intervals are alternately repeated.

7. The method of claim 1, wherein the first plurality of times is equal to the second plurality of times.

8. The method of claim 1, wherein the attribute values corresponding to the first and the second materials at the at least one point in the MR image of the object comprise at least one selected from fractions of the first and the second materials, T1 and T2 of the first material, T1 and T2 of the second material, and off-resonance between the first and second materials.

9. A non-transitory computer-readable recording medium having recorded thereon a program for executing the method of claim 1 on a computer.

10. An apparatus for processing a magnetic resonance (MR) image of an object including a first material and a second material on a magnetic resonance imaging (MRI) apparatus using multi-parameter mapping, the apparatus comprising:
a radio frequency (RF) controller configured to apply to the object a plurality of RF pulses, each of the plurality of RF pulses being separated from an adjacent RF pulse by either of a first repetition time and a second repetition time;
a data acquisition unit configured to undersample first MR signals corresponding to the first material and second MR signals corresponding to the second material in a K-space; and
an image processor configured to perform matching between the undersampled first and the undersampled second MR signals and a signal model for the multi-parameter mapping to determine attribute values corresponding to the first and the second materials at at least one point in an MR image of the object,
wherein the plurality of RF pulses have a first interval during which the first repetition time is repeated a first plurality of times and a second interval during which the second repetition time is repeated a second plurality of times.

11. The apparatus of claim 10, wherein the first and the second repetition times are predetermined based on a difference between a resonant frequency of the first material and a resonant frequency of the second material.

12. The apparatus of claim 10, wherein the first repetition time is predetermined so that the first and the second MR signals are in phase, and
wherein the second repetition time is predetermined so that the first and the second MR signals are out of phase.

13. The apparatus of claim 10, wherein the plurality of RF pulses are separated by n repetition times comprising the first and the second repetition times, the n repetition times indicating a number of repetition times.

14. The apparatus of claim 13, wherein the n repetition times are determined so that the first and the second MR signals have a phase difference of $(2\pi k)/n$, and wherein k is a natural number from 1 to n.

15. The apparatus of claim 10, wherein the first and the second intervals are alternately repeated.

16. The apparatus of claim 10, wherein the first plurality of times is equal to the second plurality of times.

* * * * *